US011366637B2

(12) United States Patent
Rovers

(10) Patent No.: US 11,366,637 B2
(45) Date of Patent: Jun. 21, 2022

(54) MULTIPLEXING BETWEEN DIFFERENT PROCESSING CHANNELS

(71) Applicant: Imagination Technologies Limited, Kings Langley (GB)

(72) Inventor: Kenneth C. Rovers, St. Albans (GB)

(73) Assignee: Imagination Technologies Limited, Kings Langley (GB)

( * ) Notice: Subject to any disclaimer, the term of this patent is extended or adjusted under 35 U.S.C. 154(b) by 0 days.

(21) Appl. No.: 17/351,449

(22) Filed: Jun. 18, 2021

(65) Prior Publication Data

US 2022/0012014 A1 Jan. 13, 2022

(30) Foreign Application Priority Data

Jun. 18, 2020 (GB) ...................................... 2009274

(51) Int. Cl.
| | | |
|---|---|---|
| G06F 7/544 | (2006.01) | |
| G06F 7/523 | (2006.01) | |
| G06F 9/30 | (2018.01) | |
| H03K 19/00 | (2006.01) | |
| H03K 19/173 | (2006.01) | |

(52) U.S. Cl.
CPC ............ *G06F 7/5443* (2013.01); *G06F 7/523* (2013.01); *G06F 9/3001* (2013.01); *G06F 9/30029* (2013.01); *G06F 9/30145* (2013.01); *H03K 19/0008* (2013.01); *H03K 19/1737* (2013.01)

(58) Field of Classification Search
None
See application file for complete search history.

(56) References Cited

U.S. PATENT DOCUMENTS 6,119,141 A * 9/2000 Chong .................... G06F 7/575
708/707
6,577,317 B1 6/2003 Duluk, Jr. et al.
(Continued)

FOREIGN PATENT DOCUMENTS

GB 2553010 A 2/2018

OTHER PUBLICATIONS

Rakosi,Z.E et al., Hot-Swapping Architecture Extension for Mitigation of Permanent Functional Unit Faults, 2009, IEEE, pp. 578-581. (Year: 2009).*

(Continued)

*Primary Examiner* — Eric Coleman
(74) *Attorney, Agent, or Firm* — Potomac Law Group, PLLC; Vincent M DeLuca

(57) ABSTRACT

A circuit for use in a processor includes a first processing channel having a first logic unit, a second processing channel having a second logic unit, and multiplexing circuitry. The multiplexing circuitry includes an input multiplexer arranged to switch between a first state in which an input of the first logic unit is coupled to an input line of the first processing channel, and a respective second state in which the input of the first logic unit is instead coupled to an input line of the second processing channel; and an output multiplexer arranged to switch between a first state in which an output line of the second processing channel is coupled to an output of the second logic unit, and a second state in which the output line of the second processing channel is instead coupled to an output of the first logic unit.

20 Claims, 14 Drawing Sheets

(56) References Cited

U.S. PATENT DOCUMENTS

| | | | |
|---|---|---|---|
| 6,883,084 B1* | 4/2005 | Donohoe | G06F 9/30181 |
| | | | 712/15 |
| 7,242,216 B1* | 7/2007 | Schmit | G11C 5/025 |
| | | | 326/39 |
| 7,636,835 B1 | 12/2009 | Ramey et al. | |
| 7,694,112 B2* | 4/2010 | Barowski | G06F 7/49921 |
| | | | 712/23 |
| 9,959,247 B1* | 5/2018 | Woo | G06F 9/30032 |
| 9,966,960 B2* | 5/2018 | Westwick | H03K 19/17728 |
| 10,521,226 B2* | 12/2019 | Sade | G06F 9/3818 |
| 10,942,985 B2* | 3/2021 | Espig | G06F 9/3893 |
| 2015/0324949 A1* | 11/2015 | Alsup | G06F 9/3001 |
| | | | 345/522 |
| 2019/0004853 A1* | 1/2019 | Anderson | G06F 9/30014 |

OTHER PUBLICATIONS

Jain, J. et al., Design and Development of Efficient Reversible Floating Point Arithmetic unit, 2015, IEEE, pp. 811-815. (Year: 2015).*

Beauchamp, M.J., et al., Architectural Modifications to Enhance the Floating-Point Performance of FPGAs, 2008, IEEE, IEEE transactions on Very large scale integration, vol. 16, No. 2, pp. 177-187. (Year: 2008).*

Manuel B. R. et al., An area efficient high speed optimized FFT algorithm, 2017 IEEE, 5 pages. (Year: 2017).*

Bi, G. et al., Pipelined Structure Based on Radix-22 FFT Algorithm, 2011, IEEE, 2015, 6th Conf. on Industrial Electronics and Applications, pp. 2530-2533. (Year: 2015).*

* cited by examiner

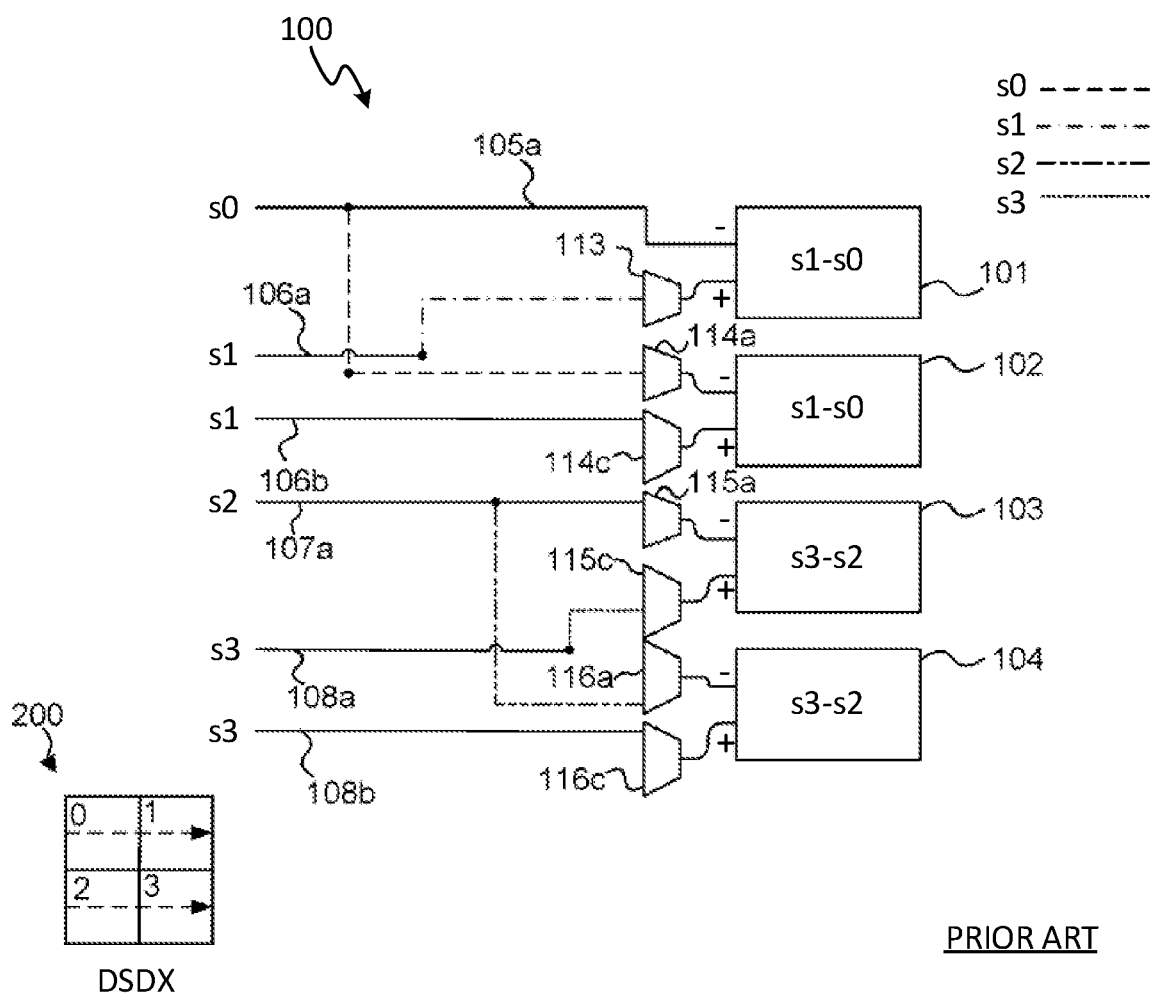

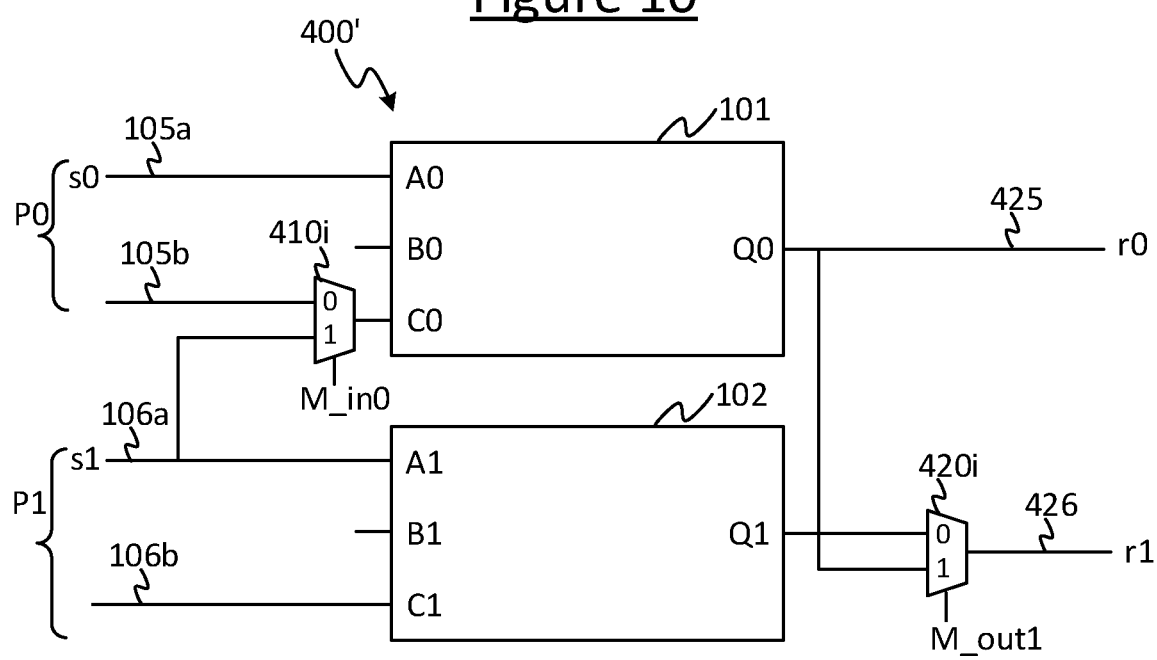
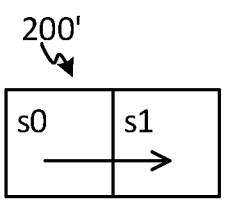
Figure 10

MULTIPLEXING BETWEEN DIFFERENT PROCESSING CHANNELS

BACKGROUND

A processor is a device for executing machine code instructions. A given processor is configured to recognize a certain predefined set of instruction types, referred to as the instruction set of the processor. Each instruction type is defined by a respective opcode and zero or more operand fields. The processor is configured to fetch instructions from memory for execution. The processor may comprise a number of different kinds of sub unit for preforming different categories of operations, depending on the type of the instruction being executed. E.g. the processor may comprise an integer arithmetic logic unit for performing integer arithmetic operations in response to arithmetic instruction types, a floating point arithmetic logic unit for performing floating point operations in response to floating point instruction types, and a load-store unit for performing memory access operations in response to load and store instruction types.

For instance, in a reduced instruction set computer (RISC), a load instruction takes at least two operands: a source memory address and an identifier specifying a destination register in a register file of the processor. When executed, the load instruction acts on the load-store unit to load a value from the source address into the destination register. Logic instructions may take different numbers of operands depending on the type of instruction. E.g. a logic instruction such as an add or multiply instruction, etc., may take three operands: two specifying two respective source registers in the register file, and one specifying a destination register in the register file. When executed the logic instruction acts on the relevant logic unit, such as an integer or floating point arithmetic logic unit, in order to perform the relevant logic operation on the values in the specified source registers, and place the result in the specified destination register. The operation to be performed, and which logic unit is triggered to perform this operation, will depend on the opcode of the instruction in question. To store the result of a logic operation back to memory involves a store instruction. A store instruction takes at least two operands: one specifying a source register in the register file and one a destination address in memory. When executed the store instruction acts on the load-store unit to store the value in the specified source register to the destination memory address.

One way in which an application-specific processor, such as a graphics processing unit (GPU), can be tailored to a specific application, is to include one or more specialised instruction types in the instruction set of the processor. Such an instruction type will perform a more complex operation than a simple load, store, add or multiply, etc., triggered in response to a single instance of a single machine code instruction of the type in question. E.g. this could be a particular mathematical operation, such as a multiply-accumulate (MAC), that comes up frequently in the application in question. The same operation could be built from a combination of general purpose add and multiply instructions, or the like, but that would reduce the code density compared to using instructions of a more specialised instruction set.

In some kinds of processor, such as a vector processor, SIMD (single instruction multiple data) or SIMT (single instruction multiple thread) processor, the processor comprises multiple parallel processing channels. Each of the parallel processing channels may comprise a respective instance of at least one of the same kind of logic unit. For example, each channel may comprise a respective arithmetic logic unit (ALU) such as an integer arithmetic logic unit or floating point arithmetic logic unit. In response to execution of the same instance of the same instruction, fetched in a single fetch operation, some or all of the logic units in the different parallel channels are triggered to perform the same operation on different data, e.g. on different elements of a vector in a vector register specified as the source of the operation. For example, each ALU may be operable to perform a multiply-accumulate (MAC), also known as a multiply-add. This takes two multiplication inputs (sometimes referred to as the multiplier and multiplicand) and an addend input (also known as the accumulator), and adds the addend to the product of the two multiplication inputs. The MAC may be implemented as a fused-multiply add whereby the multiply-accumulate is performed in one fused step. The result of the MAC by each parallel logic unit may be placed in a respective element of a destination vector register.

An example application of such a processor is found in graphics processing, where it is often required to perform the same operation on different pixels in parallel. For instance, GB 2,553,010 (Nield et al) discloses a processor with four parallel ALUs for performing different instances of the same operation for four adjacent pixels or image fragments in a 2×2 cluster. Each ALU can perform a respective multiply accumulate on its respective input value (e.g. pixel value) in parallel with the ALUs in response to the same instance of the same MAC instruction.

In most operations the respective ALU or processing unit of each channel operates only on that channel's own respective input data. However, Nield also discloses the inclusion of multiplexing circuity which enables the crossing over of an input value from the input line of one channel to the logic unit of another channel. This can be used to implement, for example, a gradient operation to be performed in response to a gradient instruction. E.g. this may be a ds/dx operation to determine the gradient between adjacent pixels in the x direction, or a ds/dy operation to determine the gradient between adjacent pixels in the y direction. These operations may be performed in response to a dedicated DSDX or DSDY instruction in the processor's instruction set.

SUMMARY

It is recognized herein that it would be desirable to provide an alternative design to Nield. For instance, it is recognized herein that the multiplexing circuitry disclosed by Nield is more complex than it could be, and there is also an opportunity to save on power consumption compared to the approach used in Nield.

According to one aspect disclosed herein, there is provided a circuit for use in a processor, the circuit comprising a first processing channel, a second processing channel, multiplexing circuitry and control circuitry. The first processing channel comprises: a respective first input line, second input line and output line, and a first logic unit configured to perform an operation on a respective first input and second input of the first logic unit to produce a respective result at a respective output of the first logic unit, wherein the first input of the first logic unit is coupled to the first input line of the first processing channel. The second processing channel comprises: a respective first input line, second input line and output line, and a second logic unit configured to perform an operation on a respective first input and second input of the second logic unit to produce a respective result at a respective output of the second logic unit, wherein the first input of the second logic unit is coupled to the first input line of the second processing channel. The multiplexing circuitry comprises at least a first input multiplexer and a first output multiplexer. The first input multiplexer is arranged to switch between: a respective first state in which the second input of the first logic unit is coupled to the second input line of the first processing channel, and a respective second state in which the second input of the first logic unit is instead coupled to the first input line of the second processing channel. The first output multiplexer is arranged to switch between: a respective first state in which the output line of the second processing channel is coupled to the output of the second logic unit, and a respective second state in which the output line of the second processing channel is instead coupled to the output of the first logic unit. The circuit further comprises control circuitry arranged to control the multiplexing circuitry in response to instructions being executed.

The disclosed circuit is based on the realization that, when performing a gradient operation in Nield, each of the ALUs always has to perform its own instance of the operation in question (e.g. gradient operation) in order to produce a respective value at its respective output, even though some of those operations are exactly the same as one another. I.e. the same operation is duplicated across two ALUs. For instance referring to FIGS. 4 and 5c-d of Nields, to perform a fine ds/dx gradient operation, the top two ALUs both perform the same subtraction of pixel 0 form pixel 1, and both the bottom two ALUs perform the same subtraction of pixel 3 from pixel 2 (based on the approximation that the gradient from one pixel to the next in the x direction is approximately constant over a small distance). However, it is recognized herein that this duplication is not necessary. The presently disclosed circuit instead uses only one of a pair of logic units (e.g. ALUs) to perform a given operation, and uses multiplexing circuitry at the output to route the output of one logic unit to the output line of both respective processing channels. This will be illustrated in more detail shortly by way of example by comparing FIGS. 1 and 3c-d as presented herein (corresponding to FIGS. 4 and 5a-d of Nield) with FIGS. 4 and 5a-b of the present disclosure (showing embodiments of the approach disclosed herein).

The disclosed principle may be exploited in order to provide one or both of at least two possible advantages. Firstly, it can save on multiplexing circuitry because it is not necessary to route input signals to the inputs of logic units that would only perform duplicate computations anyway. Secondly, it can save power because one of the logic units in a pair does not need to perform the duplicate operation.

For instance, in embodiments, the control circuitry may be arranged to switch between a first mode in which the first input and output multiplexers are each set to the respective first state, and a second mode in which the first input and output multiplexers are each set to the respective second state, with the output line of the first processing channel being coupled to the output of the first processing channel in both the first and second modes.

In some such embodiments, the control circuitry may be configured to set the second processing unit to an idle, reduced-power state when in the second mode.

By routing the output of one logic unit to the output lines of both channels, and setting the unused logic unit to an idle state, it is thus possible to save power compared to the approach of duplicating operations across a pair of logic units as disclosed in Nield. This may comprise for example clock-gating the unused logic unit, or giving the unused logic unit a fixed input such as 0.

In embodiments, the circuit may further comprise a third processing channel, and the multiplexing circuitry may comprise a second input multiplexer and a second output multiplexer. In such embodiments, the third processing channel comprises: a respective first input line, second input line and output line, and a third logic unit configured to perform an operation on a respective first input and second input of the third logic unit to produce a respective result at a respective output of the third logic unit, wherein the first input of the third logic unit is coupled to the first input line of the third processing channel. The second input multiplexer is arranged to switch between: a respective first state in which the second input of the third logic unit is coupled to the second input line of the third processing channel, and a respective second state in which the second input of the third logic unit is instead coupled to the first input line of the first processing channel. The second output multiplexer is arranged to switch between: a respective first state in which the output line of the first processing channel is coupled to the output of the first logic unit, and a respective second state in which the output line of the first processing channel is instead coupled to the output of the third logic unit.

In embodiments, the control circuitry may be configured to switch between the first mode, the second mode and a third mode; wherein in the first mode the second input and output multiplexers are each set to the respective first state, in the second mode the second output multiplexer is set to the respective first state, and in the third mode the first output multiplexer is set to the respective first state and the second input and output multiplexers are each set to the respective second state.

This reduces the amount of multiplexing circuitry required compared to the approach used in Nield. Because the input line of the first logic unit only needs to be routed to the input of the third logic unit, and not the input of the second logic unit, then the presently disclosed approach only requires one two-way multiplexer at the input of each logic unit and one two-way multiplexer at the output of each logic unit. Whereas in Nield a two-way multiplexer is required on one input of a logic unit input whilst a three-way multiplexer is required on the other input of the same logic unit. E.g. compare the second logic unit 102 in FIGS. 4 and 5a-b of the present disclosure with its counterpart in FIGS. 1 and 3c-d (FIGS. 4 and 5c-d in Nield).

In some such embodiments, the control circuitry may be configured to set the third logic unit to an idle, reduced-power state when in the second mode; and to set the first logic unit to an idle, reduced-power state when in the third mode.

In further embodiments, the circuit may comprise a fourth processing channel; and the multiplexing circuity may comprise a third input multiplexer, a fourth input multiplexer, a third output multiplexer, and a fourth output multiplexer. In such embodiments, the fourth processing channel comprises: a respective first input line, second input line and output line, and a fourth logic unit configured to perform an operation on a respective first input and second input of the fourth logic unit to produce a respective result at a respective output of the fourth logic unit, wherein the first input of the fourth logic unit is coupled to the first input line of the fourth processing channel. The third input multiplexer is arranged to switch between: a respective first state in which the second input of the second logic unit is coupled to the second input line of the second processing channel, and a respective second state in which the second input of the second logic unit is instead coupled to the first input line of the fourth processing channel. The fourth input multiplexer is arranged to switch between: a respective first state in which the second input of the fourth logic unit is coupled to the second input line of the fourth processing channel, and a respective second state in which the second input of the fourth logic unit is instead coupled to the first input line of the third processing channel. Further, the third output multiplexer is arranged to switch between: a respective first state in which the output line of the fourth processing channel is coupled to the output of the fourth logic unit, and a respective second state in which the output line of the fourth processing channel is instead coupled to the output of the second logic unit. And the fourth output multiplexer is arranged to switch between: a respective first state in which the output line of the third processing channel is coupled to the output of the third logic unit, and a respective second state in which the output line of the third processing channel is instead coupled to the output of the fourth logic unit.

In embodiments, in the first mode the third and fourth input multiplexers and the third and fourth output multiplexers may each be set to the respective first state, in the second mode the fourth input multiplexer and fourth output multiplexer are each set to the respective second state whilst the third output multiplexer is set to the respective first state, and in the third mode the third input multiplexer and third output multiplexer are each set to the respective second state whilst the fourth output multiplexer is set to the respective first state.

In some such embodiments, the control circuitry may be configured to set the fourth logic unit to an idle, reduced-power state in the third mode. The circuit may be embodied in hardware on an integrated circuit.

According to another aspect disclosed herein there may be provided a corresponding method of operating the circuit of any embodiment disclosed herein.

According to another aspect there may be provided a method of manufacturing the circuit at an integrated circuit manufacturing system. There may be provided an integrated circuit definition dataset that, when processed in an integrated circuit manufacturing system, configures the system to manufacture the circuit. There may be provided a non-transitory computer readable storage medium having stored thereon a computer readable description of a circuit that, when processed in an integrated circuit manufacturing system, causes the integrated circuit manufacturing system to manufacture an integrated circuit embodying a circuit as disclosed herein.

There may be provided an integrated circuit manufacturing system comprising: a non-transitory computer readable storage medium having stored thereon a computer readable description of the circuit; a layout processing system configured to process the computer readable description so as to generate a circuit layout description of an integrated circuit embodying the circuit; and an integrated circuit generation system configured to manufacture the circuit according to the circuit layout description.

There may be provided computer program code for performing any of the methods described herein. There may be provided non-transitory computer readable storage medium having stored thereon computer readable instructions that, when executed at a computer system, cause the computer system to perform any of the methods described herein.

The above features may be combined as appropriate, as would be apparent to a skilled person, and may be combined with any of the aspects of the examples described herein.

This Summary is provided merely to illustrate some of the concepts disclosed herein and possible implementations thereof. Not everything recited in the Summary section is necessarily intended to be limiting on the scope of the disclosure. Rather, the scope of the present disclosure is limited only by the claims.

BRIEF DESCRIPTION OF THE DRAWINGS

Examples will now be described in detail with reference to the accompanying drawings in which:

FIG. 10 is a schematic block diagram of a circuit for use in the execution unit of a processor according to alternative embodiments disclosed herein.

Figure 1:
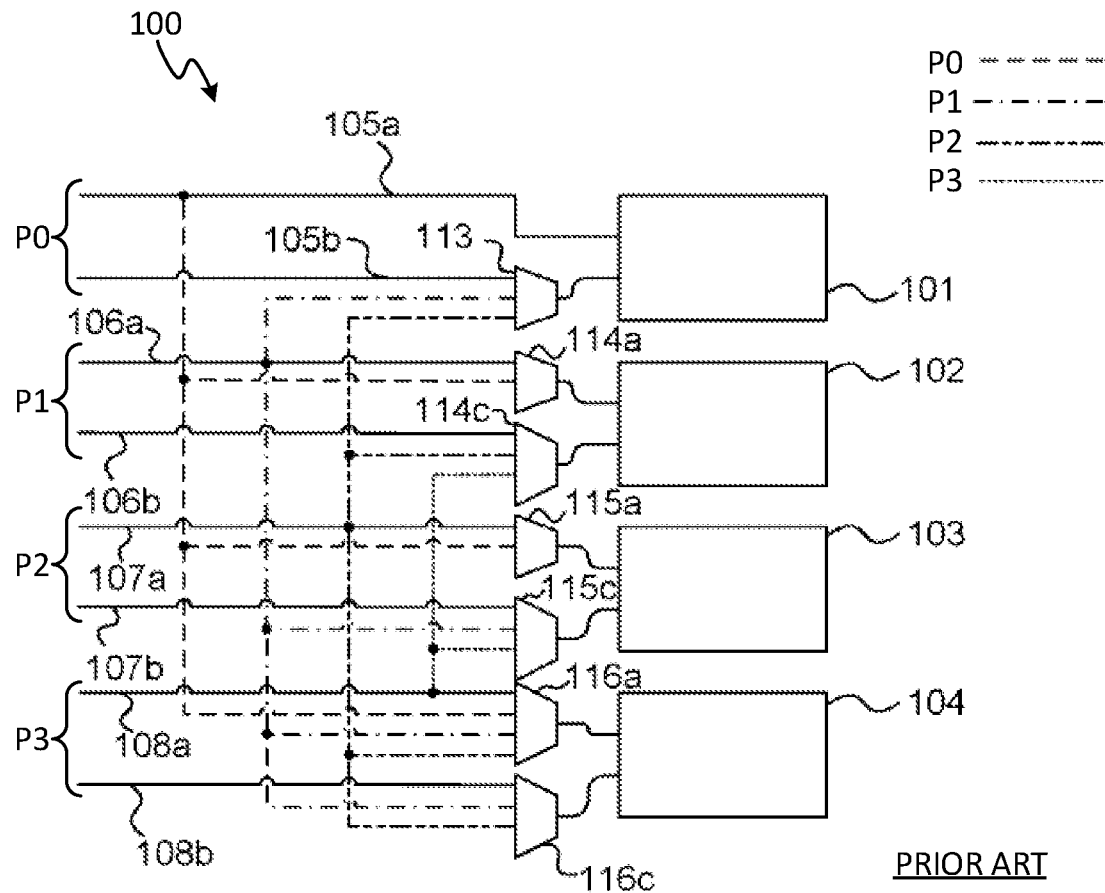
FIG. 1 is a schematic block diagram of a known circuit for use in a processing block of a processor, FIG. 2 schematically illustrates a cluster of four adjacent pixels, FIG. 3a schematically illustrates the operation of the circuit of FIG. 1 when executing a coarse gradient instruction for determining a gradient in the x direction, FIG. 3b schematically illustrates the operation of the circuit of FIG. 1 when executing a coarse gradient instruction for determining a gradient in the y direction, FIG. 3c schematically illustrates the operation of the circuit of FIG. 1 when executing a fine gradient instruction for determining a gradient in the x direction, FIG. 3d schematically illustrates the operation of the circuit of FIG. 1 when executing a fine gradient instruction for determining a gradient in the y direction.

The accompanying drawings illustrate various examples. The skilled person will appreciate that the illustrated element boundaries (e.g., boxes, groups of boxes, or other shapes) in the drawings represent one example of the boundaries. It may be that in some examples, one element may be designed as multiple elements or that multiple elements may be designed as one element. Common refer-

DETAILED DESCRIPTION

The following description is presented by way of example to enable a person skilled in the art to make and use the invention. The present invention is not limited to the embodiments described herein and various modifications to the disclosed embodiments will be apparent to those skilled in the art. Embodiments will now be described by way of example only.

FIG. 1 of the present document reproduces the schematic of an existing circuit 100 as disclosed previously in GB 2,553,010 (Nield et al). (This corresponds to FIG. 4 in Nield.) The circuit 100 is designed for use in a processing block of a processor such as a GPU (graphics processing unit).

The circuit 100 of Nield comprises a plurality of parallel processing channels P, in this case four processing channels P0 . . . P3. Each processing channel P0 . . . P3 comprises a respective logic unit, labelled 101, 102, 103, 104 respectively. For example each of these may comprise a respective arithmetic logic unit (ALU). Each processing channel P0 . . . P3 comprises a respective first input line and second input line: respective first and second input lines 105a, 105b of the first channel P0; respective first and second input lines 106a, 106b of the second channel P1; respective first and second input lines 107a, 107b of the third channel P2; and respective first and second input lines 108a, 108b of the fourth channel P3. Each respective logic unit 101 . . . 104 also comprises at least a respective first and second input to the logic unit itself, and a respective output from the logic unit (i.e. the input and output terminals of the logic unit).

The circuit 100 also comprises multiplexing circuitry 113-116c. This comprises: a three-way multiplexer 113 of the first processing channel P0, a two-way multiplexer 114a and three-way multiplexer 114c of the second processing channel P1, a two-way multiplexer 115a and three-way multiplexer 115c of the third processing channel P2, and a four-way multiplexer 116a and three-way multiplexer 116c of the fourth processing channel P3.

The first input line 105a of the first processing channel P0 is coupled to the first input of the first logic unit 101. The three-way multiplexer 113 of the first processing channel P0 is arranged to selectively couple the second input of the first logic unit 101 to any selected one of: the second input line 105b of the first channel P0, the first input line 106a of the second channel P1, or the first input line 107a of the third channel P2.

The two-way multiplexer 114a of the second processing channel P1 is arranged to selectively couple the first input of the second logic unit 102 to either selected one of: the first input line 106a of the second channel P1, or the first input line 105a of the first channel P0. The three-way multiplexer 114c of the second processing channel P1 is arranged to selectively couple the second input of the second logic unit 102 to any selected one of: the second input line 106b of the second channel P1, the first input line 107a of the third channel P2, or the first input line 108a of the fourth channel P3.

The two-way multiplexer 115a of the third processing channel P2 is arranged to selectively couple the first input of the third logic unit 103 to either selected one of: the first input line 107a of the third channel P2, or the first input line 105a of the first channel P0. The three-way multiplexer of the third processing channel P2 is arranged to selectively couple the second input of the third logic unit 103 to any selected one of: the second input line 107b of the third channel P2, the first input line 106a of the second channel P1, or the first input line 108a of the fourth channel P3.

The four-way multiplexer 116a of the fourth processing channel P3 is arranged to selectively couple the first input of the fourth logic unit 104 to any selected one of: the first input line 108a of the fourth channel P3, the first input line 105a of the first channel P0, the first input line 106a of the second channel P1, or the first input line 107a of the third channel P2. The three-way multiplexer 116c of the fourth processing channel P3 is arranged to selectively couple the second input of the fourth logic unit 104 to any selected one of: the second input line 108b of the fourth channel P3, the first input line 106a of the second channel P1, or the first input line 107a of the third channel P2.

Each logic unit 101 . . . 104 is operable to perform one or more types of operation in response to one or more types of logic instruction being executed by the processor. The supported operations include at least a subtraction operation, and preferably also a multiply-accumulate (MAC) operation. Where a MAC is supported, each logic unit 101 . . . 104 comprises at least three respective inputs: two respective multiplication inputs (multiplier and multiplicand inputs) and an addend input (also called the accumulator input). In this case the first input of each logic unit as mentioned above is one of the respective multiplication inputs, and the second input mentioned above is the respective addend input. The two multiplication inputs of each logic unit are operable to receive two respective multiplication values, sometimes referred to as a multiplicand and multiplier. The addend input is operable to receive an addend value (the accumulator value). When performing a multiply-accumulate (MAC), the logic unit determines a product of the two multiplication values and adds the addend to the product. Such a logic unit can also be used to perform a subtraction. Depending on implementation, this may be done for example by setting one of the multiplication inputs to −1, or by switching the logic to an alternative mode in which it subtracts one of the multiplication inputs from the addend input (and ignores the other multiplication input) instead of performing the MAC.

In a first, normal mode of operation, the multiplexers 113-116c are simply set to couple the respective first and second input lines of their own respective processing channel P0 . . . P3 to the first and second inputs of the respective logic unit 101 . . . 104 of that channel. So the input lines 105a, 105b of the first channel P0 are coupled to the inputs of the first logic unit 101; and the input lines 106a, 106b are coupled to the inputs of the second logic unit 102; etc. This mode may be used to enable each logic unit 101 . . . 104 to perform a multiply-accumulate (MAC) operation on the respective values received on the respective first and second inputs lines of its own respective channel P0 . . . P3 (also using the respective other multiplication input to each logic unit, not shown in FIG. 1).

However, in further modes of operation, the multiplexers 113-116c in the circuit 100 of FIG. 1 can be set to perform cross-over operations whereby the input line of one channel is routed to the logic unit of another. These operations comprise gradient operations for determining the difference between the values input on the input lines of different processing channels.

Figure 2:
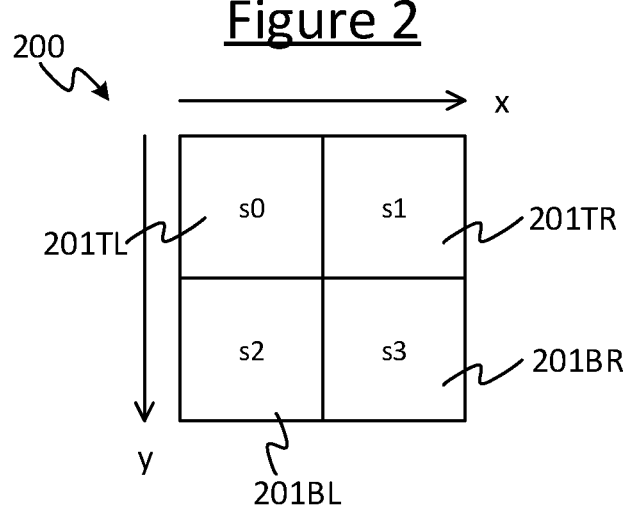
Figure 4:
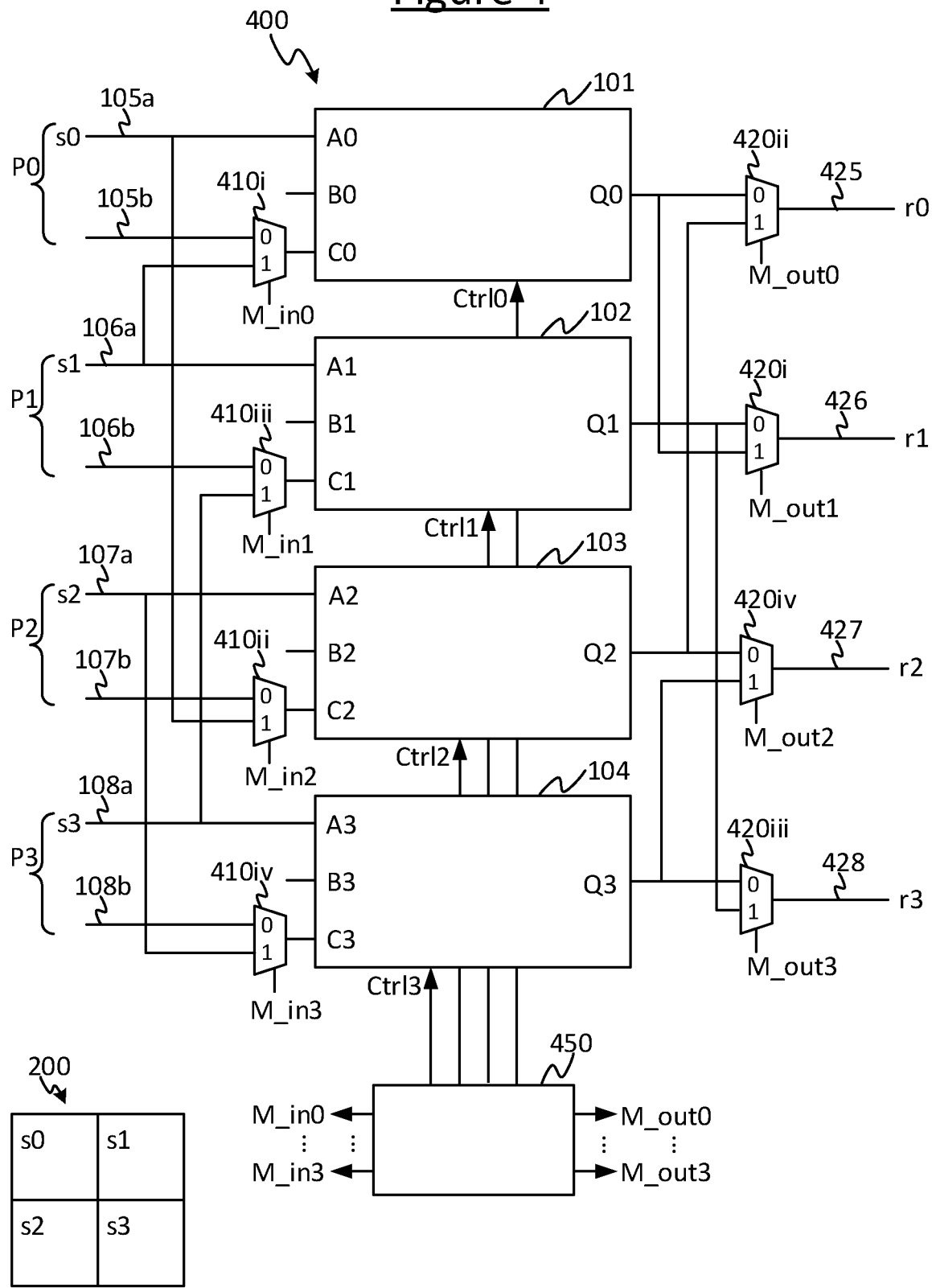
FIG. 4 is a schematic block diagram of a circuit for use in the execution unit of a processor according to embodiments disclosed herein, FIG. 5a schematically illustrates the operation of the circuit of FIG. 4 in a second mode of operation such as for executing a gradient instruction to determine a gradient in the x direction, FIG. 5b schematically illustrates the operation of the circuit of FIG. 4 in a third mode of operation such as for executing a gradient instruction to determine a gradient in the y direction, FIG. 6a schematically illustrates the operation of the circuit of FIG. 4 in a fourth mode of operation such as for executing a swap instruction to swap values in the x direction, FIG. 6b schematically illustrates the operation of the circuit of FIG. 4 in a fifth mode of operation such as for executing a swap instruction to swap values in the y direction.

FIG. 2 illustrates an example application of the circuit 100 of FIG. 1 (and of the circuit 400 of FIG. 4, to be discussed in more detail shortly). FIG. 2 shows a 2×2 block of four adjacent pixels: a top-left pixel 201TL, a top-right pixel 201TR, a bottom-left pixel 201BL and a bottom-right pixel 201BR. "Right" here means a greater x coordinate and "left" a lesser x coordinate, whilst "top" means a lesser y coordinate and "bottom" means a greater y coordinate. The top pixels 201TL & 201TR are the top-most in the block, but not necessarily the top-most in the image or screen area as a whole; and similarly the right pixels 201TR & 201BR are the right-most in the block, but again not necessarily the right-most in the image or screen as a whole. The four pixels 201TL, 201TR, 201BL, 201BR are adjacent to one another, meaning having consecutive values of the x and/or y coordinates at whatever resolution pixels are being processed at in the operations in question.

Each pixel 201TL, 201TR, 201BL & 201BR has a respective associated signal value s0, s1, s2, s3 respectively. These are the input values to the operations being performed on the pixels. For instance each input signal could be an intensity of the pixel, or a value of a particular colour channel in a colour space such as RGB or YUV, or a shading or texture value, etc. For a given type of operation to be performed (e.g. a gradient operation), the signals s0 . . . s3 typically all represent the same kind of quantity as one another (e.g. intensity or texture, etc.).

The respective input signal s0 . . . s3 from each pixel 201TL, 201TR, 201BL & 201BR is associated with a different respective one of the parallel processing channels P0 . . . P3. Each signal s0 . . . s3 may be input on one of the input lines (e.g. the respective first input line 105a, 106a, 107a, 108a) of a different respective one of the processing channels P0 . . . P3. In the first, normal (non-crossover) mode, each logic unit 101 . . . 104 operates on the input signal value s0 . . . s3 of its own respective processing channel P0 . . . P3 and none of the others. E.g. it may multiply the pixel value by a respective multiplier value (not shown) and accumulate the product with an addend input received on the respective second input line 105b, 106b, 107b, 108b.

Note: whilst described by way of example in terms of pixels, the input signals s0 . . . s3 could equally be signals representing image fragments. As will be familiar to a person skilled in the art, in a typical graphics pipeline, an application outputs a 3D model defined in terms of a plurality of facets, e.g. triangular facets. In successive pipeline stages, these may be translated, rotated, and have lighting effects applied. In another successive stage, the facets are projected from 3D space to the 2D space of the screen area, and some facets that fall outside the screen area may be culled. In a further pipeline stage, the 2D projections of the facets are rasterized, meaning to map them to onto a pixel grid. At this stage the points on the pixel grid may be referred to as image fragments. There is a one-to-one mapping between fragments and pixels in the x-y plane. However some of the fragments of different facets may be behind one another in the z direction. Therefore another pipeline stage will perform a hidden surface removal (also referred to as a z test or depth test), to determine which fragments are behind others in order to cull these. The remaining points after the hidden surface removal are the actual pixels to be lit up on the screen. Other pipeline stages such as texturing and shading may also be performed on fragments or pixels, depending on the order of the pipeline stages. The graphics operations disclosed anywhere herein may be performed on fragments or pixels, depending on implementation, and the signals s0 . . . s3 described anywhere herein may represent pixel values or values associated with fragments. For convenience embodiments may be described in terms of pixels by way of example, but it will be appreciated that this is not limiting and any of the disclosed embodiments could equally be applied to fragments. Note also that the stages in a graphics pipeline can be implemented in different orders.

Figure 3A:
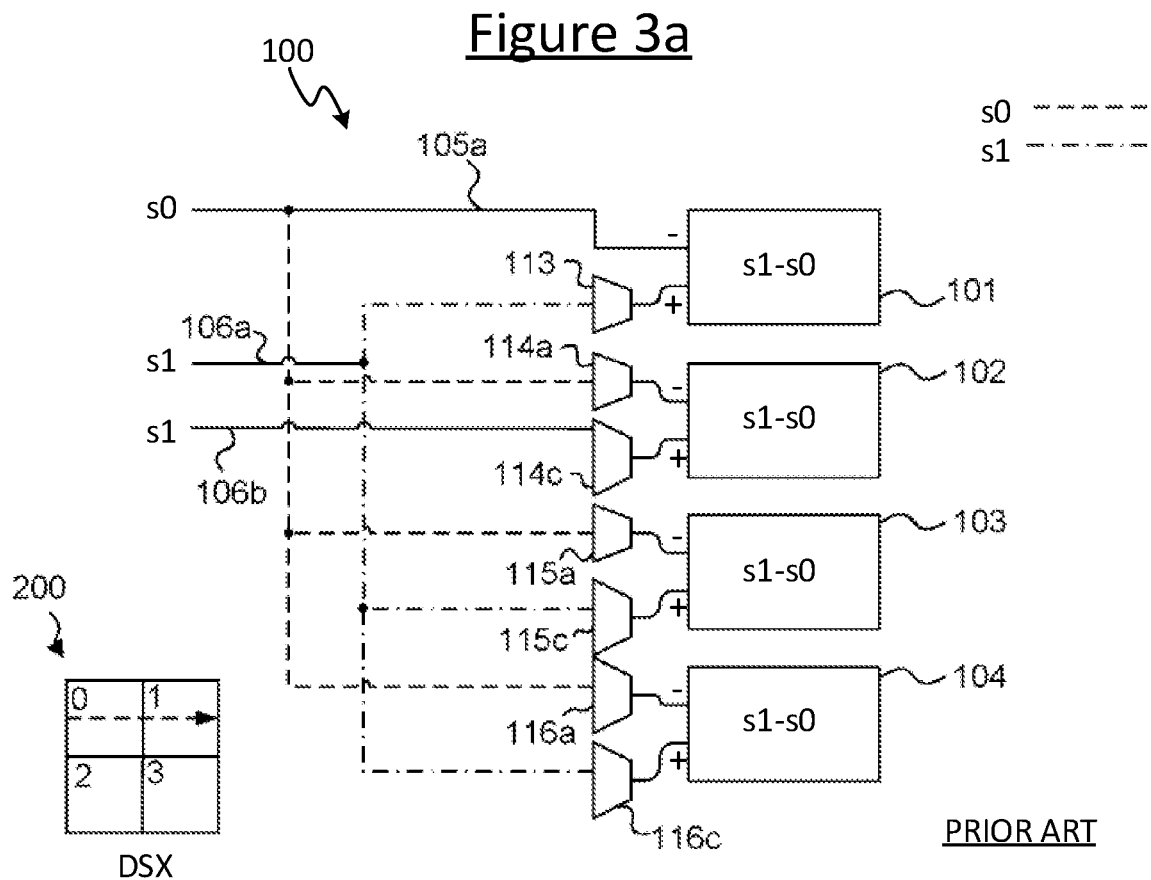

FIG. 3a shows how the circuit 100 of FIG. 1 can be used to perform a coarse gradient operation in the x direction, e.g. to execute a coarse ds/dx instruction from the processor's instruction set. This instruction may be referred to herein as DSX, but this is not intended to limit the scope of the disclosure to any particular instruction of any particular instruction set. The multiplexing circuitry 113-116c is set so as to route s0 to the first input of each of the logic units 101 . . . 104, and to route s1 to the second input of each logic unit 101 . . . 104. Each logic unit 101 . . . 104 is set to a state where it performs a subtraction of its respective first input from its second input, rather than a MAC (e.g. by negating the first input and setting the other multiplication input, not shown, to 1; or by simply setting the logic unit to a mode where it ignores the other multiplication input and performs a subtraction operation rather than a MAC). Thus each of the logic units 101 . . . 104 performs s1−s0 and outputs the result of this as the gradient of the respective pixel (or fragment) 201TL, 201TR, 201BL, 201BR associated with the respective processing channel P0 . . . P3. This makes the approximation that the gradient at each pixel within the 2×2 block is approximately the same. Note also that dx is 1 in magnitude, so determining ds/dx amounts to determining ds (a subtraction) in the relevant direction, in this case the positive x direction.

Figure 3B:
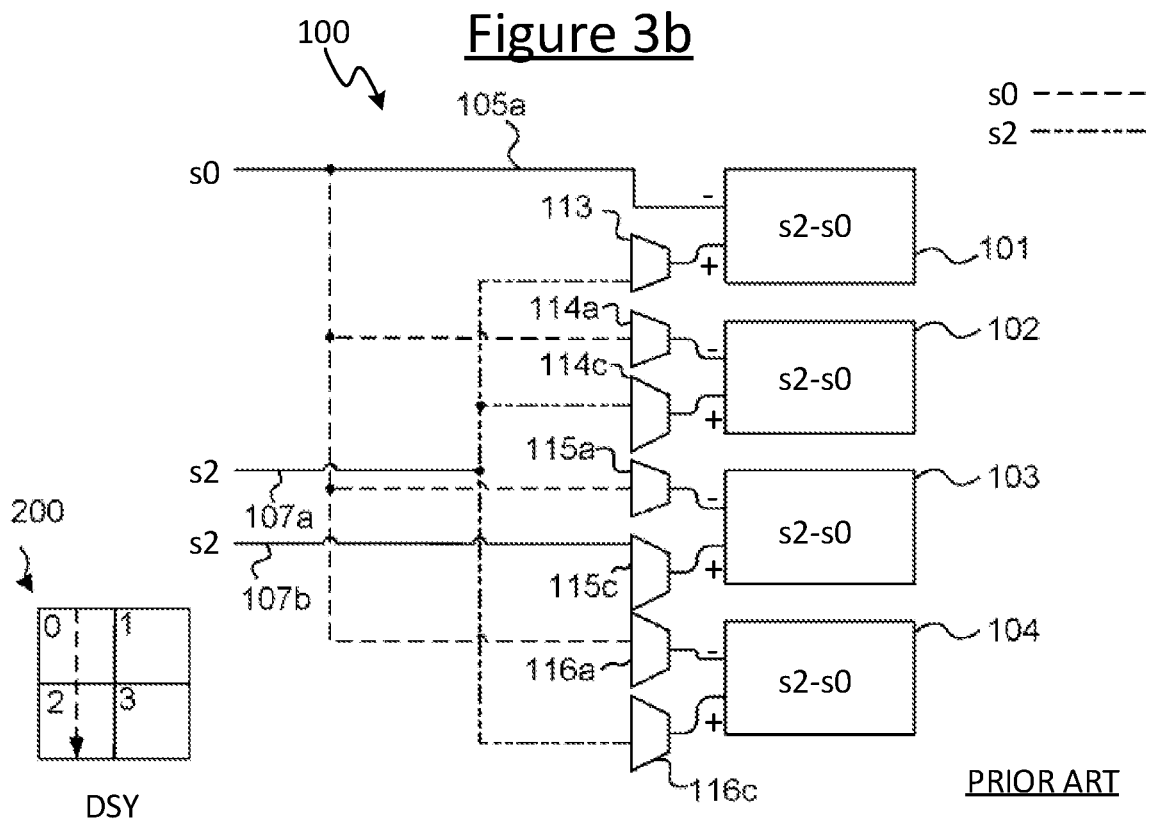

FIG. 3b shows how the circuit 100 of FIG. 1 can be used to perform a coarse gradient operation in the y direction, e.g. to execute a coarse ds/dy instruction from the processor's instruction set. This instruction may be referred to herein as DSY, but this is not intended to limit the scope of the disclosure to any particular instruction of any particular instruction set. The multiplexing circuitry 113-116c is set so as to route s0 to the first input of each of the logic units 101 . . . 104, and to route s2 to the second input of each logic unit 101 . . . 104. Each logic unit 101 . . . 104 is set to a state where it performs a subtraction of its respective first input from its second input (e.g. again by negating the first input). Thus each of the logic units 101 . . . 104 performs s2−s0. This again makes the approximation that the gradient at each pixel is approximately the same.

FIG. 3c shows how the circuit 100 of FIG. 1 can be used to perform a fine gradient operation in the x direction, e.g. to execute a fine ds/dx instruction from the processor's instruction set. This instruction may be referred to herein as DSDX, but this is not intended to limit the scope of the disclosure to any particular instruction of any particular instruction set. The multiplexing circuitry 113-116c is set so as to route s0 to the first input of each of the first and second logic units 101, 102; and to route s2 to the first input of each of the third and fourth logic units 103, 104. The multiplexing circuitry 113-116c also routes s1 to the second input of each of the first and second logic units 101, 102; and routes s3 to the second input of each of the third and fourth logic units 103, 104. Each logic unit 101 . . . 104 is set to a state where it performs a subtraction of its respective first input from its second input (e.g. as above). Thus each of the first and second logic units 101, 102 performs s1−s0 and outputs the result of this as the gradient of its respective pixel (or fragment) 201TL, 201TR respectively. And each of the third and fourth logic units performs s3−s2 and outputs the result of this as the gradient of its respective pixel (or fragment) 201BL, 201BR respectively. This makes the approximation that the gradient is approximately the same for two adjacent pixels in the x direction, i.e. s|x−s|(x−1) approximately equals s|(x+1)−s|x (where "|" means "evaluated at"). In other words, the gradient in the x direction is modelled as being pseudo-constant in the x direction, i.e. approximately the same over a small distance from one pixel (or fragment) to the next in the x direction. Thus in the x direction the gradient of s0 is taken as being the same as the gradient of s1 (ds/dx of s0 is approximately equal to ds/dx of s1). The same approximation is made mutatis mutandis between s2 and s3.

Figure 3D:
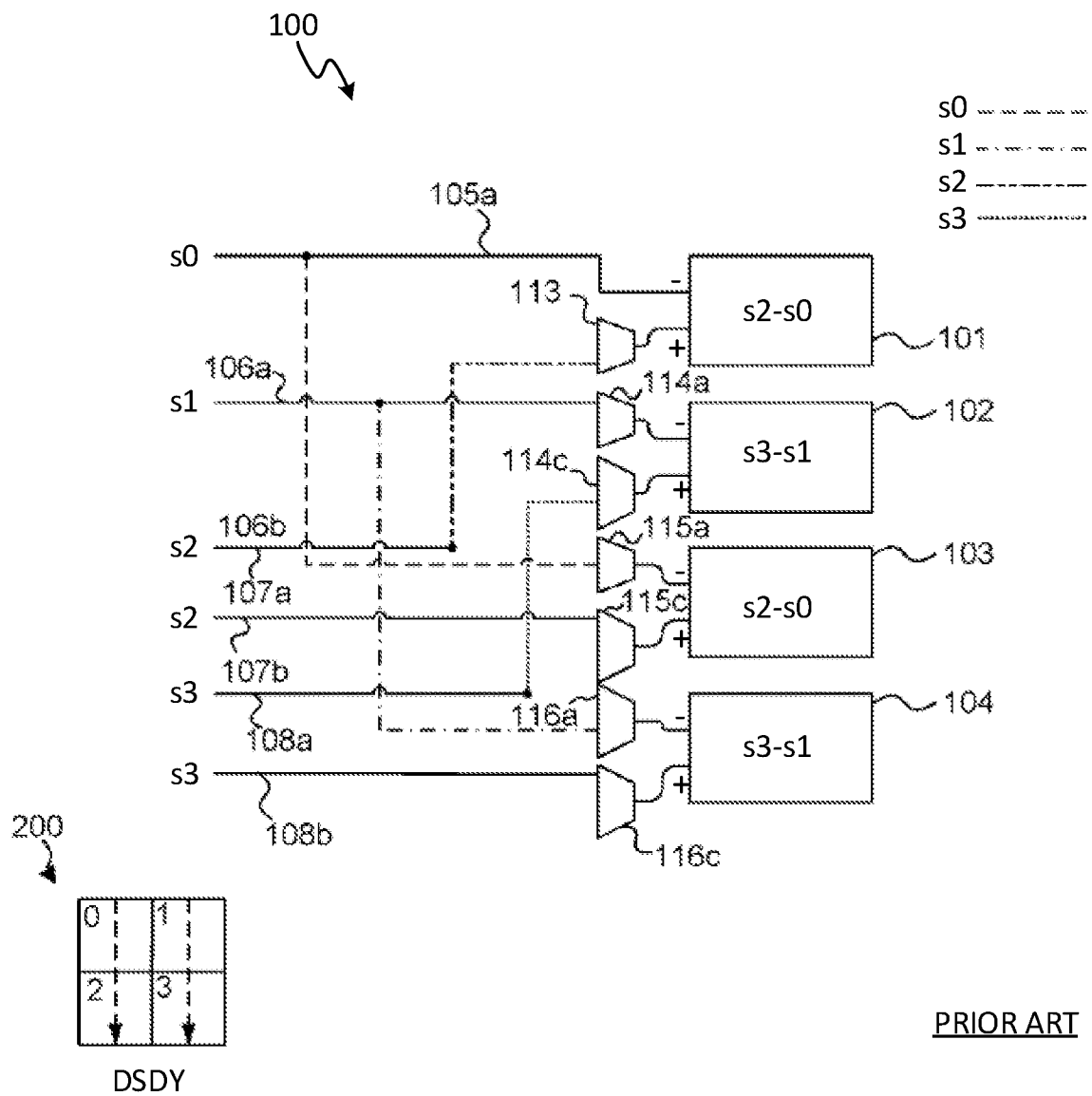

FIG. 3d shows how the circuit 100 of FIG. 1 can be used to perform a fine gradient operation in the y direction, e.g. to execute a fine ds/dy instruction from the processor's instruction set. This instruction may be referred to herein as DSDY, but this is not intended to limit the scope of the disclosure to any particular instruction of any particular instruction set. The multiplexing circuitry 113-116c is set so as to route s0 to the first input of each of the first and third logic units 101, 103; and to route s1 to the first input of each of the second and fourth logic units 102, 104. The multiplexing circuitry 113-116c also routes s2 to the second input of each of the first and third logic units 101, 103; and routes s3 to the second input of each of the second and fourth logic units 102, 104. Each logic unit 101 . . . 104 is again set to a state where it performs a subtraction of its respective first input from its second input. Thus each of the first and third logic units 101, 103 performs s2−s0 and outputs the result of this as the gradient of its respective pixel (or fragment) 201TL, 201BL respectively. And each of the second and fourth logic units 102, 104 performs s3−s1 and outputs the result of this as the gradient of its respective pixel (or fragment) 201TR, 201BR respectively. This makes the approximation that the gradient is approximately the same for two adjacent pixels in the y direction, i.e. s|y−s|(y−1) approximately equals s|(y+1)−s|y.

Note that a gradient value of each respective pixel is required to be output by each processing channel in association with the respective pixel. The gradient of, or associated with, a given pixel is a short-hand used herein to mean the gradient of the signal s at the x and y coordinates of the respective pixel. If the gradient is calculated over a step of 1 pixel in the x or y direction, then dx or dy is 1 in magnitude and determining the gradient amounts to determining the difference in the positive x or y direction.

It will be seen, once pointed out herein, that in FIG. 3c both of the first and second logic units 101, 102 each perform a duplicate instance of the same operation s1−s0.

And both of the third and fourth logic units each perform a duplicate instance of the same operation s3−s2. A similar observation may be made in FIG. 3d mutatis mutandis in the y direction.

FIG. 4 discloses and example of a circuit 400 which avoids this duplication by applying some of the multiplexing on the output lines of the processing channels P0 . . . P3 rather than just on the input lines.

The circuit 400 comprises a plurality of parallel processing channels P, in this example four processing channels P0 . . . P3. Each processing channel P0 . . . P3 comprises a respective logic unit, again labelled 101, 102, 103, 104 respectively. For example each of these may comprise a respective arithmetic logic unit (ALU), such as an integer arithmetic logic unit or a floating point arithmetic logic unit. As in FIG. 1, each processing channel P0 . . . P3 comprises a respective first input line and second input line: respective first and second input lines 105a, 105b of the first channel P0; respective first and second input lines 106a, 106b of the second channel P1; respective first and second input lines 107a, 107b of the third channel P2; and respective first and second input lines 108a, 108b of the fourth channel P3. Each processing channel P0 . . . P3 also comprises a respective output line 425, 426, 427, 428. Each respective logic unit 101 . . . 104 also comprises at least a respective first input A and second input C to the logic unit itself, and a respective output Q from the logic unit (i.e. the input and output terminals of the logic unit).

The first input line of each processing channel P0 . . . P3 is coupled to the respective first input A0 . . . A3 of the respective logic unit 101 . . . 104. That is, the first input line 105a of the first processing channel P0 is coupled to the first input A0 of the first logic unit 101. The first input line 106a of the second processing channel P1 is coupled to the first input A1 of the second logic unit 102. The first input line 107a of the third processing channel P2 is coupled to the first input A2 of the third logic unit 103. The first input line 108a of the fourth processing channel P3 is coupled to the first input A3 of the fourth logic unit 104.

The circuit 400 further comprises multiplexing circuitry 410i-iv, 420i-iv for selectively coupling input lines to the inputs of the logic units 101 . . . 104, and selectively output lines of the processing channels to the outputs of the logic units. This enables input lines of each processing channel P0 . . . P3 to be selectively routed to inputs of different ones of the logic units 101, 102, 103, 104 in certain combinations.

The input multiplexers comprise a first input multiplexer 410i, a second input multiplexer 410ii, a third input multiplexer 410iii, and a fourth input multiplexer 410iv. The output multiplexers comprise a first output multiplexer 420i, a second output multiplexer 420ii, a third output multiplexer 420iii, and a fourth output multiplexer 420iv. The circuit 400 further comprises control circuitry 450, coupled to a respective control input of each of the logic units; and to a respective control inputs of each of the multiplexers 410i-iv, 420i-iv. The control circuitry 450 is arranged to supply a respective control signal M_in0 . . . M_in3 and M_out0 . . . M_out3 to each of the input and output multiplexers 410i . . . 410iv and 420i . . . 420iv respectively, in order to switch the multiplexers. The control circuitry 450 is also arranged to supply a respective control signal Ctrl0 . . . Ctrl3 to each of the logic units (e.g. ALUs) 101 . . . 104 respectively, in order to control the logic units 101 . . . 104 themselves such as to switch mode (e.g. between MAC and subtract) and/or to set some of them to an idled, low-power state when unused, such as by clock-gating the unit. (N.B. in embodiments each of Ctrl0 . . . Ctrl3 could represent a plurality of individual constituent signals for different control purposes, such as a respective mode signal for controlling the mode and a respective power state signal for switching the unit between the idle and operative state). Alternatively the reduced-power state could be created, for example, by setting the data inputs A, B, C of the respective unit to a static value such as 0.

The first input multiplexer 410i is arranged to selectively couple the second input C0 of the first logic unit 101 to either selected one of: the second input line 105b of the first processing channel P0, or the first input line 106a of the second processing channel P1. The selection is made via a respective control signal M_in0 received from the control circuitry 450.

The second input multiplexer 410ii is arranged to selectively couple the second input C2 of the third logic unit 103 to either selected one of: the second input line 107b of the third processing channel P2, or the first input line 105a of the first processing channel P0. The selection is made via a respective control signal M_in2 received from the control circuitry 450.

The third input multiplexer 410*iii* is arranged to selectively couple the second input C1 of the second logic unit 102 to either selected one of: the second input line 106*b* of the second processing channel P1, or the first input line 108*a* of the fourth processing channel P3. The selection is made under control of a respective control signal M_in1 received from the control circuitry. The selection is made via a respective control signal M_in1 received from the control circuitry 450.

The fourth input multiplexer 410*iv* is arranged to selectively couple the second input C3 of the fourth logic unit 104 to either selected one of: the second input line 108*b* of the fourth processing channel P3, or the first input line 107*a* of the third processing channel P2. The selection is made via a respective control signal M_in3 received from the control circuitry 450.

The first output multiplexer 420*i* is arranged to selectively couple the output line 426 of the second processing channel P1 to either selected one of: the output Q1 of the second processing unit 102, or the output Q0 of the first logic unit 101. The selection is made via a respective control signal M_out1 received from the control circuitry 450.

The second output multiplexer 420*ii* is arranged to selectively couple the output line 425 of the first processing channel P0 to either selected one of: the output Q0 of the first logic unit 101, or the output Q2 of the third logic unit 103. The selection is made by a respective control signal M_out0 received from the control circuitry 450.

The third output multiplexer 420*iii* is arranged to selectively couple the output line 428 of the fourth processing channel P3 to either selected one of: the output Q3 of the fourth logic unit 104, or the output Q1 of the second logic unit 102. The selection is made by a respective control signal M_out3 received from the control circuitry 450.

The fourth output multiplexer 420*iv* is arranged to selectively couple the output line 427 of the third processing channel P2 to either selected one of: the output Q2 of the third logic unit 103, or the output Q3 of the fourth logic unit 104. The selection is made by a respective control signal M_out3 received from the control circuitry 450.

Note: where is said herein that a multiplexer selectively couples one point in a circuit to either (or any) selected one of two (or more) other points in the circuit, this means it selects to couple to only one of those other points and not both (or not more than one). This applies to either a logic unit input being coupled to either/any of a plurality of input lines, and an output line being coupled to either/any of a plurality of possible logic unit outputs. Also, the term "coupled" herein means operatively coupled, which covers the possibility of being directly connected (with only a conductor in between) or coupling via one or more intermediate components. In embodiments the term "coupled" anywhere herein may be replaced with "connected" or "directly connected".

Each logic unit 101 . . . 104 is operable to perform one or more types of operation in response to one or more types of instruction being executed by the processor (e.g. integer or floating point instructions). The supported operations include at least a subtraction operation, and in embodiments also a multiply-accumulate (MAC) operation. Where a MAC is supported, each logic unit 101 . . . 104 comprises at least three respective inputs: two respective multiplication inputs A, B (multiplier and multiplicand inputs); and an addend input C (also called the accumulator input). In this case, for the present purposes, the "first" input of each logic unit is one of the respective multiplication inputs (A in the illustrated example, though it could be B in other implementations); and the "second" input is the respective addend input C. The two multiplication inputs A, B of each logic unit are operable to receive two respective multiplication values, sometimes referred to as a multiplicand and multiplier. The addend input C is operable to receive an addend value (the accumulator value). When performing a multiply-accumulate (MAC), the logic unit determines a product of the two multiplication values received at its multiplication inputs A, B, adds the addend received at the addend input C to the product, and outputs the result at the respective output Q. In other words it performs Q=AB+C. In embodiments this may be implemented as a fused-multiply add (FMA).

A logic unit for performing MACs can also be used to perform a subtraction. Depending on implementation, this may be done in a number of ways. For example, one way is by setting one of the multiplication inputs to −1 (e.g. −1*A+C=C−A). Or another way is by switching the logic unit to an alternative mode in which, instead of performing the MAC, it subtracts one of the multiplication inputs from the addend input and simply ignores the other multiplication input. Yet another possibility is by inverting the sign of A followed by an addition, when A has a sign-magnitude representation as in floating point formats.

In embodiments the control circuitry 450 may be coupled to a respective control input of each logic unit 101 . . . 104, arranged to receive a respective control signal Ctrl0 . . . Ctrl3 from the control circuitry 450. This enables the control circuitry 450 to control the ALUs 101 . . . 104 themselves, in addition to being able to control the multiplexing circuitry 410, 420 via signals M_in0 . . . 3 and M_out0 . . . 3. For example this may be used for the control circuitry 450 to control the logic units 101 . . . 104 to switch between different types of logic operation, e.g. MAC and subtract; and/or to switch unused ones of the logic units 101 . . . 104 to a reduced power state.

The first input line 105*a*, 106*a*, 107*a*, 108*a* of each processing channel P0 . . . P3 is arranged to receive a respective input signal s0 . . . s3. In embodiments, each of these signals may be the signal associated with a different respective pixel or image fragment 201TL, 201TR, 201BL, 201BR in a 2×2 block of adjacent pixels or fragments, as discussed previously with respective to FIG. 2. E.g. each signal may represent an intensity, colour channel value, texture or shading value of a different respective one of the pixels (or fragments) in the block 200.

The second input line 105*b*, 106*b*, 107*b*, 108*b* of each processing channel P0 . . . P3 may be arranged to receive another value associated with the respective signal, e.g. an accumulator.

The output line 425, 426, 427, 428 of each processing channel P0 . . . P3 is arranged to supply a respective result r0 . . . r3 as an output of the respective processing channel. In embodiments, the respective result r0 . . . r3 output by each channel P0 . . . P3 is associated with a different respective one of the pixels (or fragments) 201TL, 201TR, 201BL, 201BR in the block.

In a first, normal mode of operation, the control circuitry 450 sets the input multiplexers 410*i-iv* to couple the respective first and second input lines of each processing channel P0 . . . P3 to the respective first and second inputs A, C of the respective logic unit 101 . . . 104 of that same channel. And the output multiplexers are simply set to couple the respective output line of each channel P0 . . . P3 to the output Q0 . . . Q3 of the respective logic unit 101 . . . 104 of that channel. So the input lines 105a, 105b of the first channel P0 are coupled to the inputs A0, C0 of the first logic unit 101; and the input lines 106a, 106b are coupled to the inputs A1, C1 of the second logic unit 102; the input lines 107a, 107b of the third channel P2 are coupled to the inputs A2, C2 of the third logic unit 103; and the input lines 108a, 108b are coupled to the inputs A3, C3 of the fourth logic unit 104. In this mode, the output line 425 of the first channel P0 is coupled to the output Q0 of the first logic unit 101, the output line 426 of the second channel P1 is coupled to the output Q1 of the second logic unit 102, the output line 427 of the third channel P2 is coupled to the output Q2 of the third logic unit 103, the output line 428 of the fourth channel is coupled to the output Q3 of the fourth logic unit 104. The multiplexers are set into this configuration by the control circuitry 450, which sets the input and output multiplexers 410i-iv, 420i-iv to the relevant settings via their respective control inputs M_in0 ... M_in3, M_out0 ... M_out3.

In embodiments, this mode may be used to enable each logic unit 101 ... 104 to perform a multiply-accumulate (MAC) operation on the respective values received on the respective first and second inputs lines of its own respective channel P0 ... P3 (also using the respective other multiplication input B to each logic unit). The control circuitry 450 may control each of the logic units 101 ... 104, via the control signal Ctrl0 ... 3 supplied to their respective control inputs, to enter a state in which they perform a MAC operation on their respective inputs A, B, C and output the result at their respective output Q.

In embodiments, the control circuitry 450 may be configured to operate the circuit 400 in the first mode responsive to the execution of an instance of a MAC instruction, being a dedicated machine code instruction of the processor instruction set.

Figure 5A:
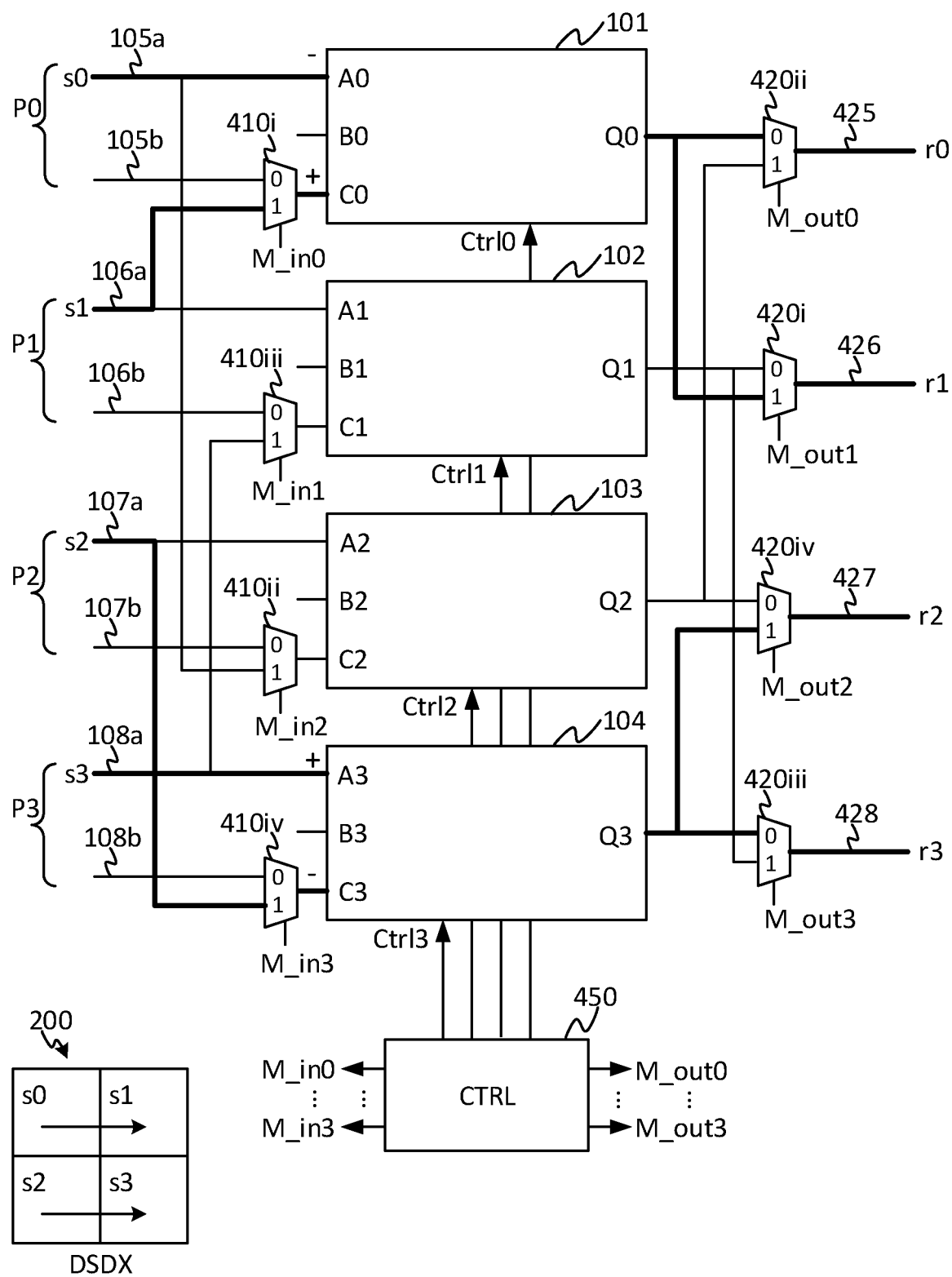

FIG. 5a illustrates how the circuit of FIG. 4 can be operated in a second, alternative mode of operation to determine differences between the input signals s0 ... s3 of different processing channels P0 ... P3. In embodiments, this may be used to perform a fine gradient operation in the x direction, such as to execute the DSDX instruction. The bold lines in FIG. 5a show where the signals are routed by the multiplexers.

In the second mode of operation, the control circuitry 450 controls the first input multiplexer 410i (via M_in0) to couple the second input C0 of the first logic unit 101 to the first input line 106a of the second processing channel P1, in order to receive s1. The control circuitry 450 also controls the fourth input multiplexer 410iv (via M_in3) to couple the second input C3 of the fourth logic unit 104 to the first input line 107a of the third processing channel P2, in order to receive s2. The state of the second and third multiplexers 410ii, 410iii does not matter in this mode.

Further, in the second mode, the control circuitry 450 controls the first output multiplexer 420i (via M_out1) to couple the output line 426 of the second processing channel P1 to the output Q0 of the first logic unit 101. The control circuitry 450 also controls the second output multiplexer 420ii (via M_out0) to couple the output line 425 of the first processing channel P0 to the output Q0 of the first logic unit 101. In this second mode, the control circuitry 450 also controls the third output multiplexer 420iii (via M_out3) to couple the output line 428 of the fourth processing channel P3 to the output Q3 of the fourth logic unit 104. It also controls the fourth output multiplexer 420iv (via M_out2) to couple the output line 427 of the third processing channel P2 to the output Q3 of the fourth logic unit 104.

Thus the signal s1 from the first input line 106a of the second processing channel P1 is routed to the logic unit 101 of the first processing channel P0; and the signal s2 from the first input line 107a of the third processing channel P2 is routed to the logic unit 104 of the fourth processing channel P3. The output Q0 of the first logic unit 101 in the first processing channel P0 is routed to the output lines 425, 426 supplying the result r0, r1 of both the first and second channels P0, P1 (e.g. corresponding to both the top row pixels 201TL, 201TR). The output Q3 of the fourth logic unit 104 in the fourth processing channel P3 is routed to the output lines 427, 428 supplying the results r2, r3 of both the third and fourth channels P2, P3 (e.g. corresponding to both the bottom row pixels 201BL, 201BR)

In the second mode of operation, the control circuitry 450 also controls the first logic unit 101 to switch to a state in which it performs a subtraction of its first input A0 from its second input C0. This may be done by controlling the logic unit 101, via the signal Ctrl0 supplied to its respective control input, to switch to a mode in which it ignores the other multiplication input (e.g. multiplicand) B and negates the first input A in order to subtract A from C. Alternatively the same result could be achieved, for example, by setting B to −1 and leaving the logic unit 101 in the MAC mode (since −1*A+C=C−A).

The control circuitry 450 also controls the fourth logic unit 104 to switch to a state in which it performs a subtraction of its second input C3 from its first input A3. This may be done by controlling the logic unit 104 (via Ctrl3) to a mode in which it ignores the other multiplication input (e.g. multiplicand) B, and negates the second input C in order to subtract C from A. Alternatively the same result could be achieved by setting B to −1, performing a MAC, and negating the output Q (since −(−1*A+C)=A−C).

The circuit 400 of FIG. 4 thus exploits the ability of the logic units to perform either C−A or A−C.

In the second mode, the first logic unit 101 performs s1−s0, and the output multiplexing circuitry 420i, 420ii routes the output Q0 to the output lines 425, 426 of both the first and second processing channels P0, P1 to deliver the respective results r0, r1 of both channels. The fourth logic unit 104 performs s3−s1, and the output multiplexing circuitry 420iii, 420iv routes the output Q3 to the output lines 427, 428 of both the third and fourth processing channels P2, P3 to deliver the respective results r2, r3 of both these channels. The second and third logic units 102, 103 are not used in the second mode.

Since there is no need to route signals to the unused logic units 102, 103, then the circuit 400 of FIG. 4 only requires two two-way multiplexers per channel (one two-way input multiplexer per channel and one two-way output multiplexer per channel). This reduces the amount of circuitry compared to the circuit 100 of FIG. 1, where each of the second to fourth channels P1 ... P3 requires a two-way multiplexer on one input and at least a three-way multiplexer on the other. Note that a three-way multiplexer is basically just formed of two two-way multiplexers.

Furthermore, in embodiments, the control circuitry 450 is configured to control the second and third logic units 102, 103 (e.g. via Ctrl1 & Ctrl2 respectively) to enter a low power state when the circuit 400 is in the second mode. In other words they are deactivated, into a state where they perform no logic operation, in order to consume less power than if performing a logic operation. However it is not essential to control the internal mode of the logic units 102, 103 to place it in a low power state that achieves at least some power saving. In alternative embodiments one could also save power by giving each of the unused logic units (in this case the second and third logic units 102,103) a static input such as 0, which would still save some power.

Moreover, the circuit of FIG. 400 is not configured to be able to perform the coarse gradient operation DSX or DSY. This saves the need for the four-way multiplexer 116c in the fourth channel P3.

In an exemplary application, the second mode may be used to determine the gradient in the x direction associated with each of the pixels (or fragments) 201. I.e. the approximate gradient of the signal s in the x direction at the point of each of the pixels (or fragments) in the 2×2 block 200.

This again uses the assumption that the gradient is pseudo-constant over an elementary increment, i.e. s|x−s| (x−1) approximately equals s|(x+1)−s|x. Thus the same gradient is output for both the top-left pixel 201TL on the first channel P0, and the top-right pixel 201TR on the second channel P1. And the same gradient is output for both the bottom-left pixel 201BL on the third channel P2, and the bottom-right pixel 201BR on the fourth channel P3.

In embodiments, the control circuitry 450 may be configured to operate the circuit 400 in the second mode in order to execute an instance of an x-direction gradient instruction, being a dedicated machine code instruction of the processor instruction set. E.g. this may be the DSDX instruction.

Figure 5B:
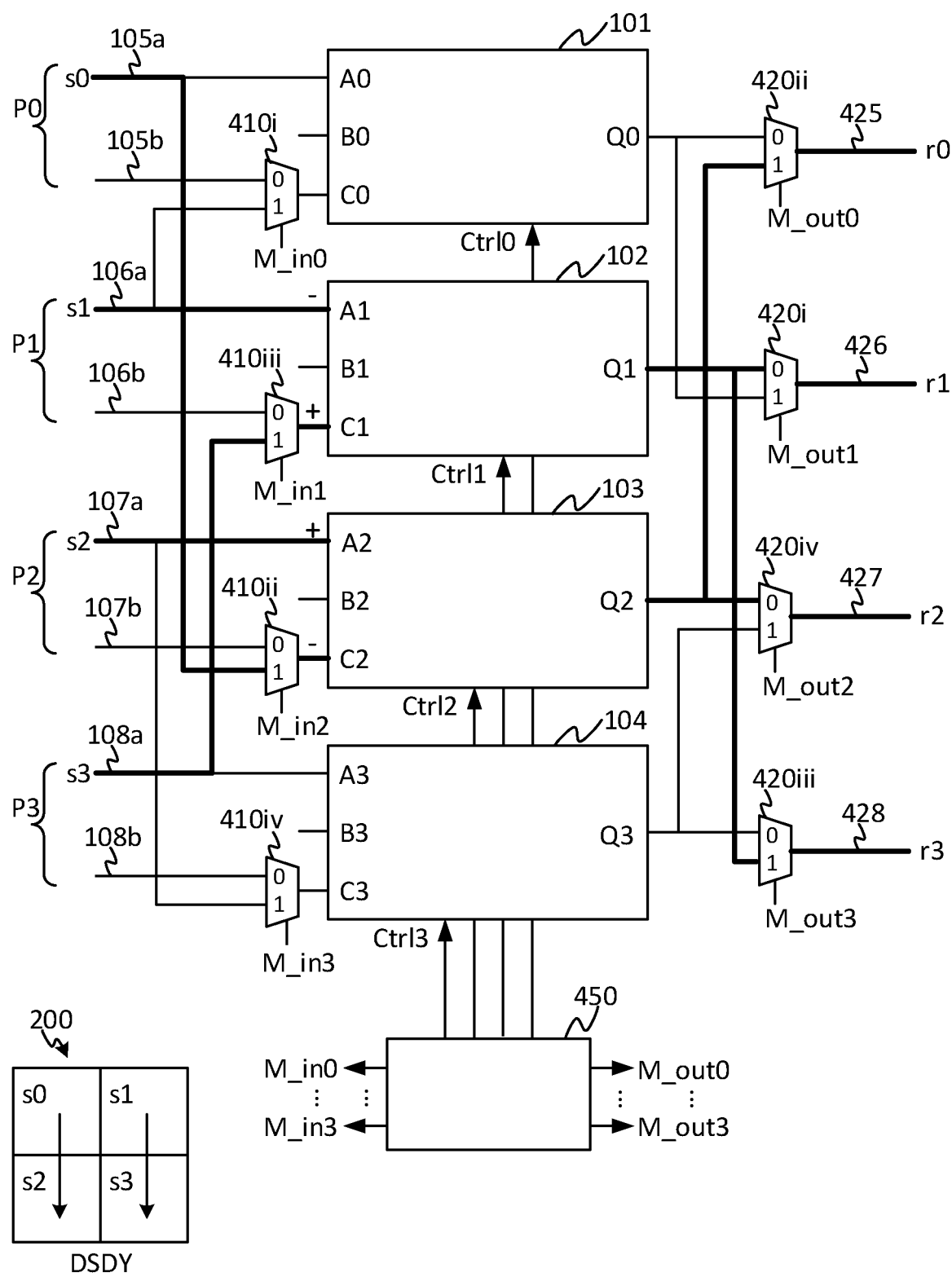

FIG. 5b illustrates how the circuit of FIG. 4 can be operated in a third, further alternative mode operation. In embodiments, this may be used to perform a fine gradient operation in the y direction, such as to execute the DSDY instruction. The bold lines in FIG. 5b again show where the signals are routed by the multiplexers in this particular mode.

In the third mode of operation, the control circuitry 450 controls the third input multiplexer 410iii (via M_in1) to couple the second input C1 of the second logic unit 102 to the first input line 108a of the fourth processing channel P0, in order to receive s3. The control circuitry 450 also controls the second input multiplexer 410ii (via M_in2) to couple the second input C2 of the third logic unit 103 to the first input line 105a of the first processing channel P0, in order to receive s0. The state of the first and fourth multiplexers 410i, 410iv does not matter in the third mode.

Further, in the third mode, the control circuitry 450 controls the first output multiplexer 420i (via M_out1) to couple the output line 426 of the second processing channel P1 to the output Q1 of the second logic unit 102. The control circuitry 450 also controls the second output multiplexer 420ii (via M_out0) to couple the output line 425 of the first processing channel P0 to the output Q2 of the third logic unit 103. In this third mode, the control circuitry 450 also controls the third output multiplexer 410iii (via M_out3) to couple the output line 428 of the fourth processing channel P3 to the output Q1 of the second logic unit 102. It also controls the fourth output multiplexer 420iv (via M_out2) to couple the output line 427 of the third processing channel P2 to the output Q2 of the third logic unit 103.

Thus the signal s0 from the first input line 105a of the first processing channel P0 is routed to the logic unit 103 of the third processing channel P2; and the signal s3 from the first input line 108a of the fourth processing channel P3 is routed to the logic unit 102 of the second processing channel P1. The output Q1 of the second logic unit 102 in the second processing channel P1 is routed to the output lines 426, 428 supplying the result r1, r3 of both the second and fourth channels P1, P3 (e.g. corresponding to both the right-hand pixels 201TR, 201BR). The output Q2 of the third logic unit 103 in the third processing channel P2 is routed to the output lines 425, 427 supplying the results r0, r2 of both the first and third channels P0, P2 (e.g. corresponding to both left-hand pixels 201TL, 201BL).

In the third mode of operation, the control circuitry 450 also controls the second logic unit 102 to switch to a state in which it performs a subtraction of its first input A from its second input C. This may be done by controlling the logic unit 102, via the signal Ctrl1 supplied its respective control input, to switch to a mode in which it ignores the other multiplication input (e.g. multiplicand) B and negates the first input A in order to subtract A form C. Alternatively for example, the same result could be achieved by setting B to −1 and leaving the logic unit 102 in the MAC mode.

The control circuitry 450 also controls the third logic unit 103 to switch to a state in which it performs a subtraction of its second input C2 from its first input A2. This may be done by controlling the logic unit 103 (via Ctrl2) to a mode in which it ignores the other multiplication input (e.g. multiplicand) B, and negates the second input C in order to subtract C from A. Alternatively the same result could be achieved by setting B to −1, performing a MAC, and negating the output Q.

In the third mode, the second logic unit 102 performs s3−s1, and the output multiplexing circuitry 420i, 420iii routes the output Q1 to the output lines 426, 428 of both the second and fourth processing channels P1, P3 to deliver the respective results r1, r3 of both channels. The third logic unit 103 performs s2−s0, and the output multiplexing circuitry 420ii, 420iv routes the output Q2 to the output lines 425, 427 of both the first and third processing channels P0, P2 to deliver the respective results r0, r2 of both these channels. The first and fourth logic units 101, 104 are not used in the third mode.

In embodiments, the control circuitry 450 is configured to control the first and fourth logic units 101, 104 to enter a an idle, low-power state when the circuit 400 is in the third mode. I.e. they are set into a state where they perform no operation, in order to consume less power than if performing an operation. This could be done by completely removing power (i.e. voltage), but such an approach is not typically done at this scale because it requires a lot of logic to safely save the state and shut down. At the scale of circuitry in question, instead therefore clock-gating may be used, or another way of keeping the signals stable for one or more clock cycles. This saves power because it is changing signals that consume most of the power in a logic circuit such as this. Energy is saved by not changing the signals in the circuit, clock gating achieves this by simply not registering new values (which happens on the rising or falling edge of the clock signal). Another possibility is simply to setting each of the data inputs A, B, C of the logic unit to a static value such as 0. Setting the inputs to 0 also achieves some power saving, but only on the second clock cycle at which point it "stays" at 0 (or mutatis mutandis of the static input value is 1).

In an exemplary application, the third mode may be used to determine the gradient in the y direction associated with each of the pixels (or fragments) 201. I.e. the approximate gradient of the signal s in the y direction at the point of each of the pixels (or fragments) in the 2×2 block 200.

This again uses the assumption that the gradient is pseudo-constant over an elementary increment, i.e. in this case s|y−s|(y−1) approximately equals s|(y+1)−s|y. Thus the same gradient is output for both the top-left pixel 201 TL on the first channel P0, and the bottom-left pixel 201 BL on the third channel P2. And the same gradient is output for both the top-right pixel 201TR on the second channel P1, and the bottom-right pixel 201BR on the fourth channel P3.

In embodiments, the control circuitry 450 may be configured to operate the circuit 400 in the third mode in order to execute an instance of a y-direction gradient instruction, being a dedicated machine code instruction of the processor instruction set. E.g. this may be the DSDY instruction.

Figure 6A:
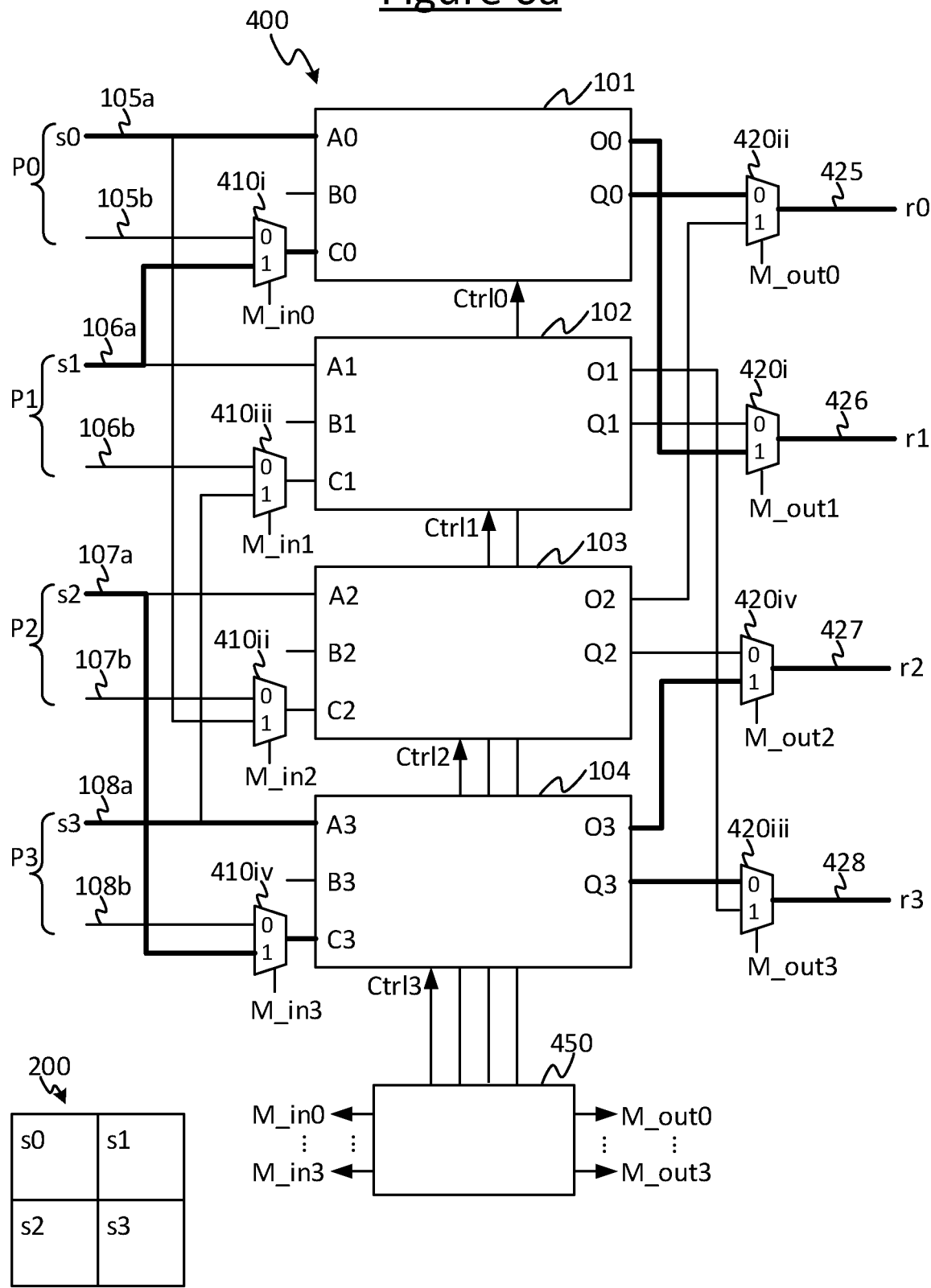

FIG. 6a illustrates how a variant of the circuit of FIG. 4 can be operated in a fourth mode of operation to perform a swap operation in the x direction, e.g. to execute a SWPX instruction. Here the input signal s0 input on the first input line 105a of the first processing channel P0 is swapped over to the output line 426 of the second processing channel P1, and the input signal s1 input on the first input line 106a of the second processing channel P1 is swapped over to the output line 425 of the first processing channel P0; and similarly for s2 and s3.

Figure 6B:
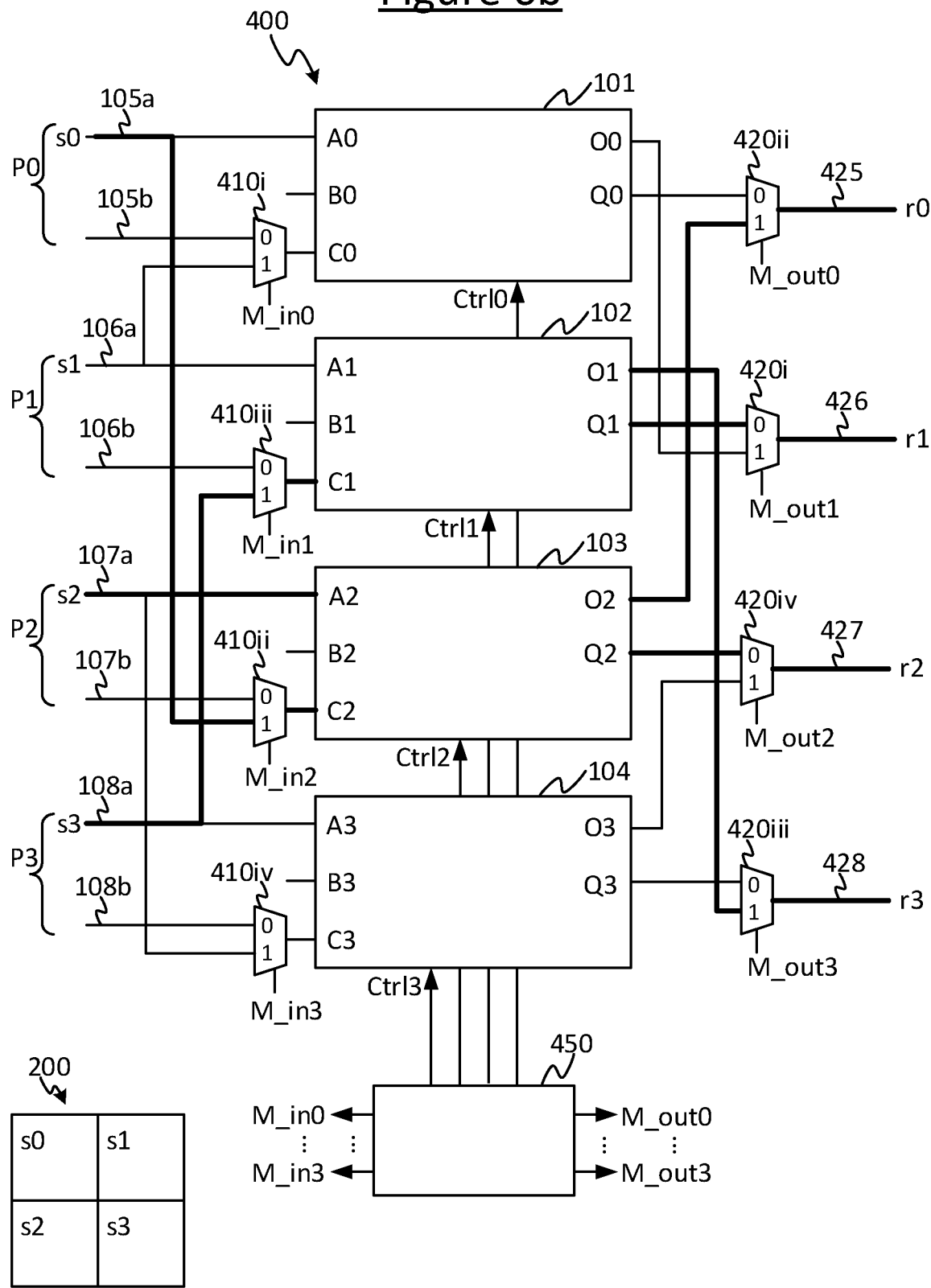

FIG. 6b illustrates how a variant of the circuit of FIG. 4 can be operated in a fifth mode of operation to perform a swap operation in the y direction, e.g. to execute a SWPY instruction. Here the input signal s0 input on the first input line 105a of the first processing channel P0 is swapped over to the output line 427 of the third processing channel P2, and the input signal s2 input on the first input line 107a of the third processing channel P2 is swapped over to the output line 425 of the first processing channel P0; and similarly for s2 and s4.

The swap re-uses the multiplexers that are already available for the gradient instructions. The swap works by using a separate channel within one of the logic units. The additional output needed can be created cheaply almost completely out of the critical path making it virtually free (because it can be known very early which signals are going to be output output). Hence the ability to perform a swap, in embodiments, gives an additional advantage of structuring the logic units and associated multiplexing circuity in the manner disclosed.

Swap x and swap y operations (e.g. SWPX and SWPY) require moving two pieces of data through (some of) the logic units 101 . . . 104. Swapping between two logic unit instances (e.g. 101, 102) is achieved by sending a value from one instance to the other on the input side input, and the other instance sending its own input back to the one instance on the output side.

To this end, the respective output of each of the logic units 101 . . . 104 may comprise two independent output terminals, O0 . . . O3 and Q0 . . . Q3, respectively. Implementing a gradient mode in this variant can be achieved by making Q and O hold the same value, in which case the circuit shown in FIGS. 6a and 6b reduces to that of FIG. 4. Note therefore that in the description of FIGS. 4 and 5a-b, or the like, reference to a given output Q may in fact, in some embodiments, refer to the logical output of the respective logic unit and not necessarily a single direct physical output connection.

In a swap mode on the other hand, Q and O of a given logic unit are set independently of one another and can take different values. the multiplexors 420 select between Q of their own logic unit and O of the other instance. For the SWPX instruction, s1 is sent from 102 to 101, which then outputs s0 via O0 and s1 via Q0. The multiplexer 420ii sends Q0 to r0. The multiplexer 420i sends O0 to r1. Observe that 102 can be switch off during this operation. The behaviour of 103 and 104 is similar and the SWPY operation is symmetrical.

So to perform a swap x operation (e.g. to execute SWPX), the multiplexing circuitry routes the signal s0 input on the first input line 105a of the first processing channel P0 to the output line r1 of the second processing channel P1 via the first input A0 and first independent output O0 of the first logic unit 101, and routes the signal s1 input on the first input line 106a of the second processing channel P1 to the output line r0 of the first processing channel P0 via the second input C0 and second independent output Q0 of the first logic unit 101. It also routes the signal s2 input on the first input line 107a of the third processing channel P2 to the output line r3 of the fourth processing channel P3 via the second input C3 and second independent output Q3 of the fourth logic unit 104, and routes the signal s3 input on the first input line 108a of the fourth processing channel P3 to the output line r2 of the third processing channel P2 via the first input A3 and first independent output O3 of the fourth logic unit 104. The second and third logic units 102, 103 do not need to be used.

To perform a swap y operation (e.g. to execute SWPY), the multiplexing circuitry routes the signal s2 input on the first input line 107a of the third processing channel P2 to the output line r0 of the first processing channel P0 via the first input A2 and first independent output O2 of the third logic unit 103, and routes the signal s0 input on the first input line 105a of the first processing channel P0 to the output line r2 of the third processing channel P3 via the second input C2 and second independent output Q2 of the third logic unit 103. It also routes the signal s3 input on the first input line 108a of the fourth processing channel P3 to the output line r1 of the second processing channel P1 via the second input C1 and second independent output Q1 of the second logic unit 102, and routes the signal s1 input on the first input line 106a of the second processing channel P1 to the output line r3 of the fourth processing channel P3 via the first input A1 and first independent output O1 of the second logic unit 102. The first and fourth logic units 101, 104 do not need to be used.

To perform a gradient operation, the two respective independent outputs O, Q of each logic unit are simply held at the same value as one other, thereby in effect forming the same output as shown in FIGS. 4 and 5a-b. I.e. O0 and Q0 are held at the same value as one another, whilst O1 and Q1 are held at the same value as one another, and O2 and Q2 are held at the same value as one another, and O3 and Q3 are held at the same value as one another.

Figure 7:
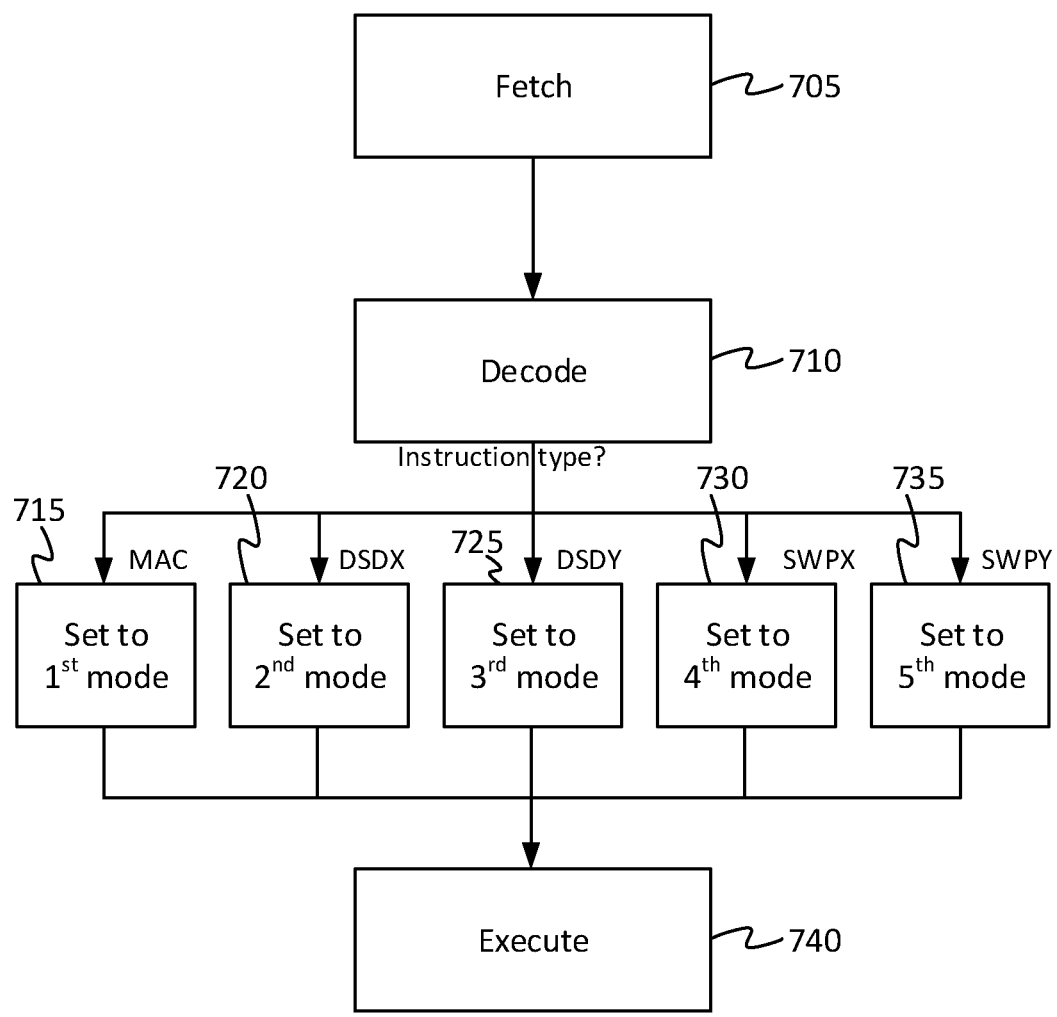
FIG. 7 is a flow chart of an example method disclosed herein.

FIG. 7 illustrates an example method in accordance with embodiments disclosed herein. At step 705 the processor fetches a machine code instruction from memory. At step S710 the processor decodes the instruction to determine what type of instruction it is based on its opcode, and to supply the relevant input data specified by the instruction's operand(s) on the input lines of the circuit 400 in the execution stage. If the instruction is determined to be of a first type, e.g. a multiply-accumulate (MAC) instruction, the method branches to step S715 where the control circuitry 450 sets the circuit 400 into the first mode. If the instruction is determined to be of a second type, e.g. a DSDX instruction, the method branches to step S720 where the control circuitry 450 sets the circuit 400 to the second mode.

In embodiments other types of instruction employing other modes of the circuit 400 may be supported. For instance, in embodiments, if the instruction is determined to be of a third type, e.g. DSDY, the method branches to step 725 where the control circuitry 450 sets the circuit 400 to the third mode. As another example, if the instruction is determined to be of a fourth type, e.g. SWPX, the method branches to step 730 where the control circuitry 450 sets the circuit 400 to the fourth mode. As another example, if the instruction is determined to be of a fifth type, e.g. SWPY, the method branches to step 735 where the control circuitry 450 sets the circuit to the fifth mode.

After it has been determined what type of instruction is being executed and the circuit 400 has been set to the relevant mode, the method proceeds to step 740 where the circuit 400 executes the instruction in the selected mode.

Figure 12:
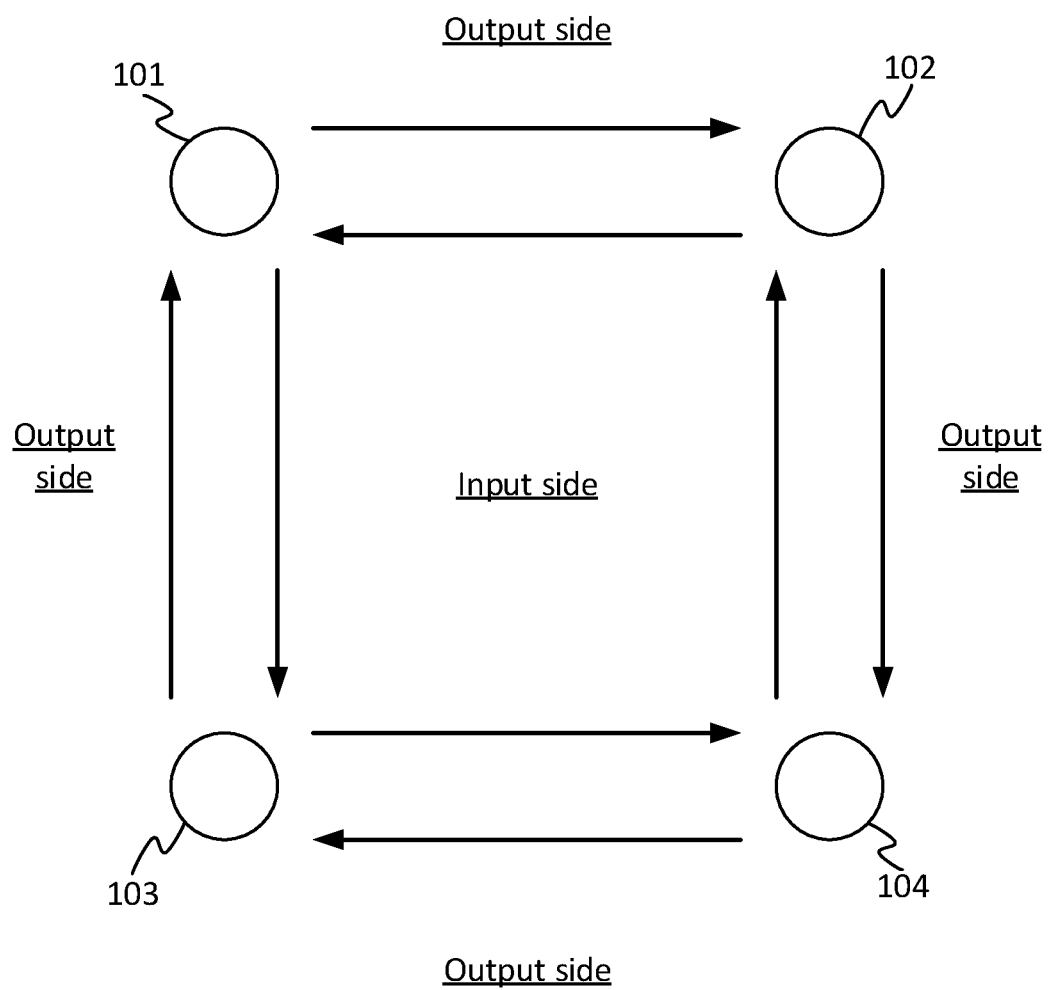
FIG. 12 is a high level schematic representation of the configuration of four logic units (e.g. ALUs) in accordance with embodiments disclosed herein.

FIG. 12 gives a high level schematic representation of the configuration of four logic units (e.g. ALUs) as shown in FIGS. 4, 5*a-b* and 6*a-b*. A different one of the logic units (e.g. ALUs) 101 . . . 104 lies in each corner of the illustration, with its inputs on the inside and its outputs on the outside.

A further possible mode of operation is revealed by studying FIG. 12. In this configuration, the DSDX (or SWPX) instruction is computed by the top-left and bottom-right ALUs, while the DSDY (or SWPY) instruction is computed by the top-right and bottom-left ALUs. This means that in fact, in embodiments, the DSDX and DSDY could be computed in parallel. In other words, a ds/dx gradient operation and a ds/dy gradient operation could be performed in parallel, i.e. at the same time. This configuration also enables 4-way clockwise or counter-clockwise swaps.

The illustrated configuration cannot simultaneously swap top-left with top-right, bottom-left with bottom-right, top-left with bottom-left, and top-right with bottom right (i.e. both swap x and swap y simultaneously). In fact it can swap them, but as it has only a single output line per channel, it can only output one of the swaps at a time. In further embodiments the circuit could be extended again with an additional output line to enable a swap x and swap y to be performed on parallel (as opposed to just x direction swaps or y-direction swaps, or just clockwise or counter clockwise swaps).

If will be appreciated that the above embodiments have been described by way of example. For instance, it is not essential that the logic units 101 . . . 104 are ALUs or floating point units capable of performing MAC operations in the first mode. The principles of crossing over the data lines of the channels at the input and output of the logic units could also be employed in other arrangements where the processing channels comprise other types of logic unit. The logic units could perform different types of operation in the first mode than in the second mode (as described above); or alternatively they could perform the same type of operation in the first and second modes, but on different combinations of input data. For instance in the first mode a given processing channel may determine the difference between its own two respective inputs; whereas in the second mode it may determine the difference between the crossed-over input lines.

The principles disclosed herein can also be generalized to execution circuits with other numbers of processing channels. FIG. 10 shows the simplest case of a circuit 400' with only the first and second channels P0, P1; e.g. for processing a 2×1 block of pixels 200'. In the first mode the circuit 400' can be used to perform parallel operations (e.g. parallel MACs) using the respective logic unit 101, 102 of each channel P0, P1 to operate on only the signals received on its own respective input lines. In the second mode, the logic unit 101 in the first channel P0 is used to compute s1−s0 and output the result for both channels P0, P1. The logic unit 102 in the second channel P1 may be set to an idle, low-power state when the circuit is in the second mode (e.g. by powering down, or more preferably by clock-gating or setting inputs to a static value, as discussed previously).

Figure 11:
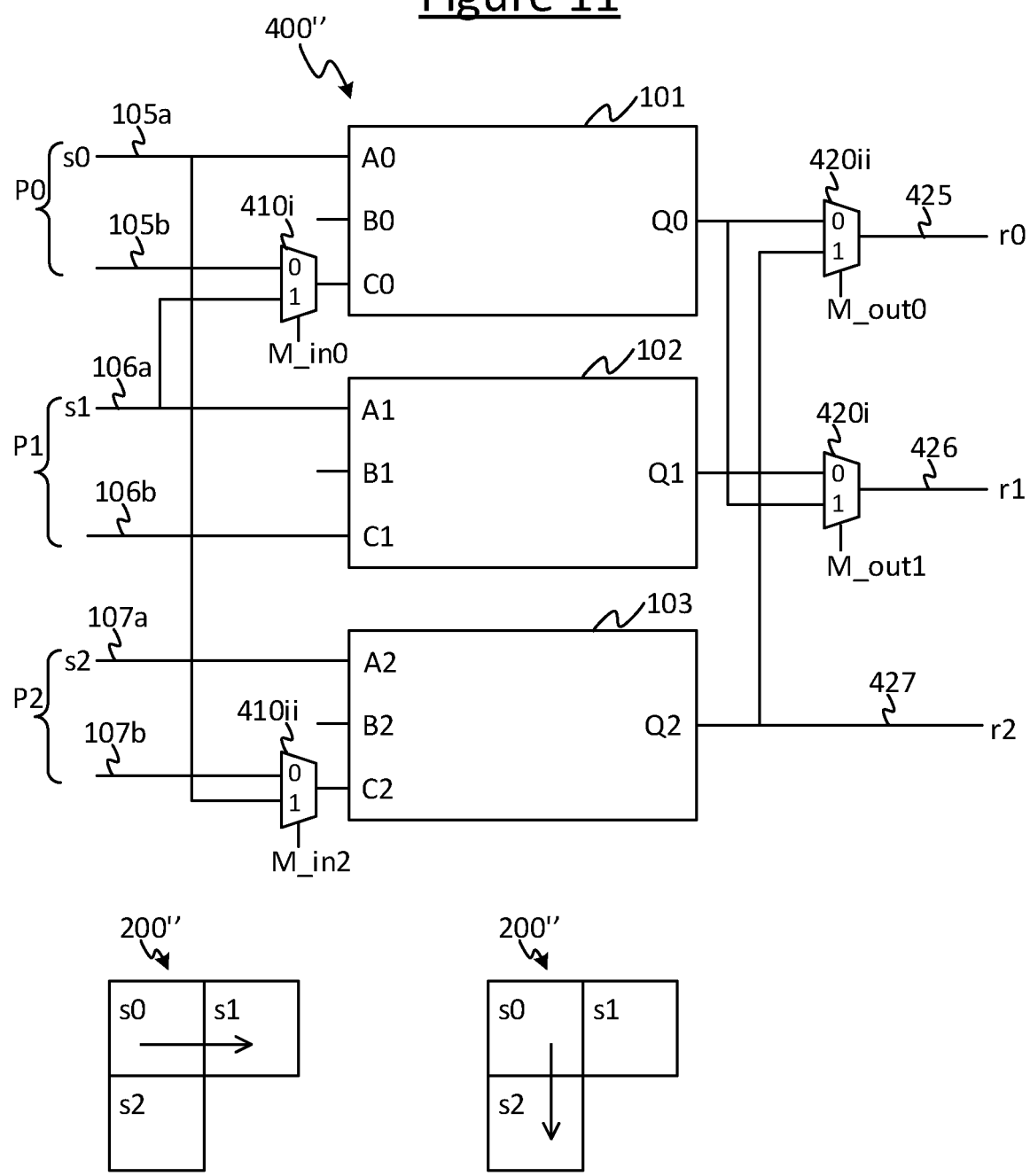
FIG. 11 is a schematic block diagram of a circuit for use in the execution unit of a processor according to further alternative embodiments disclosed herein.

FIG. 11 shows another variant 400" of the circuit, this time having with three channels: P0, P1, P2. This can be used either to perform three parallel operations in the first mode (e.g. three parallel MACs), or to perform ds/dx between s1 and s0 in a first mode, or ds/dy between s2 and s0 in the third mode. For instance this could be used to process an L-shaped block of three pixels 200".

Furthermore, it is possible to extend the concept beyond four channels, for instance for a 3×2 or 2×3 block of pixels. This will involve extra multiplexing circuitry compared to the circuit shown in FIG. 4. For instance consider a circuit with six processing channels processing a 2×3 block of pixels (2 in the x direction by 3 in the y direction), where the signals of the extra two pixels on the bottom row are labelled s4 and s5 from left to right respectively. As an example, the gradient in the y direction of all three left-hand pixels could be approximated to be the same, and the input signals s0, s2, s4 of all three pixels could be routed to the logic unit of one processing unit to perform the gradient operation on behalf of all three of them.

Also the disclosed techniques can be used for other applications other than processing blocks of pixels in parallel. The circuits of the present disclosure could be used in any application that involves processing signals in parallel where, at some times, it desired to have each processing channel operate only on its own respective inputs, and at other times it is desired to determine a gradient or difference between the signals associated with different channels, or even more generally to operate on inputs of different channels.

Figure 8:
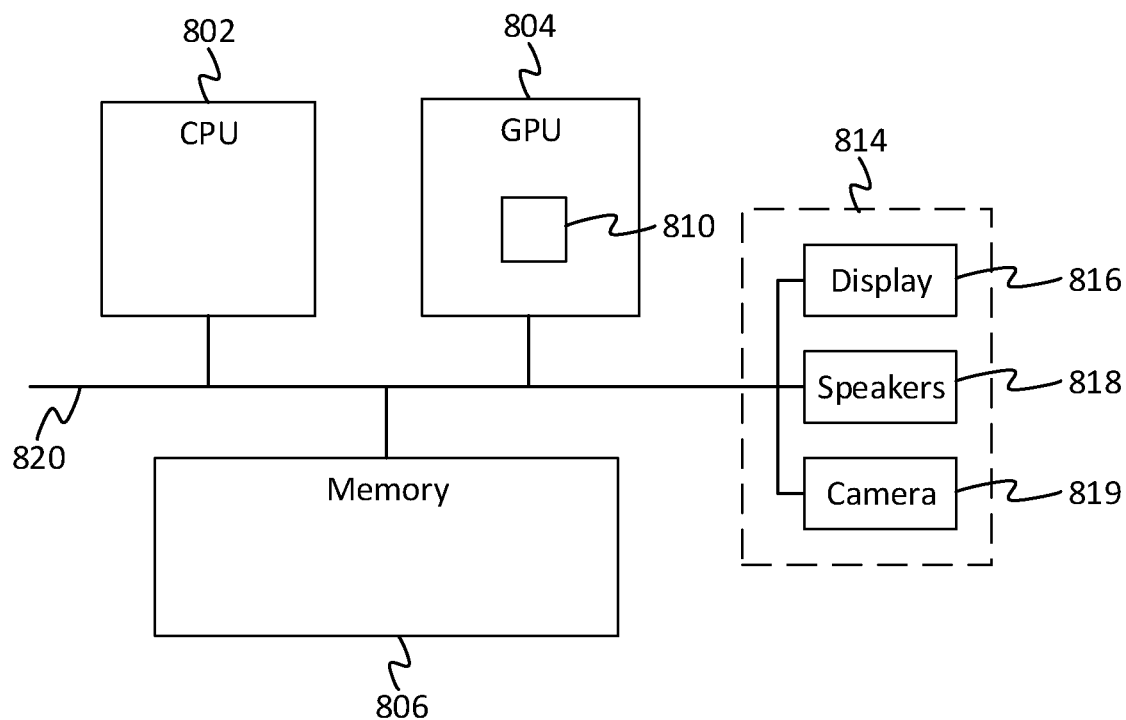
FIG. 8 is a schematic block diagram of a computer system in which a graphics processing system is implemented.

FIG. 8 shows a computer system in which any of the circuits described herein may be implemented. The computer system comprises a central processing unit (CPU) 802, a graphics processing unit (GPU) 804, a memory 806, and one or more other devices 814 such as a display 816, speakers 818 and/or a camera 819. In embodiments the GPU 804 may be arranged as an accelerator processor and the CPU 802 may be arranged as a host of the GPU. The memory 806 comprises one or more memory units employing one or more volatile and/or non-volatile memory media, e.g. a magnetic medium such as a hard disk; or an electronic medium such as a ROM, EEPROM, flash memory, (SSD), etc.

A processing block 810 which comprises the above-described circuit 400 is implemented in the GPU 804. In other examples, the processing block 810 may be implemented in the CPU 802 or another form processor (not shown) such as a digital signal processor, neural network accelerator processor, crypto processor, etc., or any other form of application specific or general purpose processor. Also whilst an arrangement of host (CPU) and accelerator processor (e.g. GPU) is shown here, in alternative arrangements the processor in which the processing block 810 is implemented may be arranged in a stand-alone processor, or in another relationship within a multi-processor system. The components of the computer system are arranged to be able to communicate with each other via a communications bus 820 or other such interconnect.

The processor in which the processing block 810 is implemented, e.g. the GPU 804, is arranged to fetch instructions from memory 806 and pass them to the processing block 810 to be decoded and executed. The processing block 810 comprises one or more of types of logic unit for performing logical operations specified by the fetched instructions. This processing block 810 includes the circuit 400 described above, including the processing channels comprising the logic units (e.g. ALUs) 101-104, arranged to execute logic instructions (e.g. arithmetic or floating point instructions such as MACs, gradient instructions and swap instructions).

In a reduced instruction set (RISC) type processor, the operations may be performed on values held in registers of a register file (not shown) implemented on the same processor as the processing block 810, in which case the processing block 810 further comprises a load-store unit for loading values from memory 806 into the register file and storing values from the register file back to memory in response to load and sore instructions respectively. The data may be stored in the same memory unit as the instructions or a different memory unit of the overall memory 806 of the processor. The logic unit(s) and load-store unit may be pipelined with respect to one another.

The circuits of FIGS. 4-6 are shown as comprising a number of functional blocks. This is schematic only and is not intended to define a strict division between different logic elements of such entities. Each functional block may be provided in any suitable manner.

The circuits described herein may be embodied in hardware on an integrated circuit. The circuits described herein may be configured to perform any of the methods described herein. Generally, any of the functions, methods, techniques or components described above can be implemented in software, firmware, hardware (e.g., fixed logic circuitry), or any combination thereof. The terms "module," "functionality," "component", "element", "unit", "block" and "logic" may be used herein to generally represent software, firmware, hardware, or any combination thereof. In the case of a software implementation, the module, functionality, component, element, unit, block or logic represents program code that performs the specified tasks when executed on a processor. The algorithms and methods described herein could be performed by one or more processors executing code that causes the processor(s) to perform the algorithms/methods. Examples of a computer-readable storage medium include a random-access memory (RAM), read-only memory (ROM), an optical disc, flash memory, hard disk memory, and other memory devices that may use magnetic, optical, and other techniques to store instructions or other data and that can be accessed by a machine.

The terms computer program code and computer readable instructions as used herein refer to any kind of executable code for processors, including code expressed in a machine language, an interpreted language or a scripting language. Executable code includes binary code, machine code, bytecode, code defining an integrated circuit (such as a hardware description language or netlist), and code expressed in a programming language code such as C, Java or OpenCL. Executable code may be, for example, any kind of software, firmware, script, module or library which, when suitably executed, processed, interpreted, compiled, executed at a virtual machine or other software environment, cause a processor of the computer system at which the executable code is supported to perform the tasks specified by the code.

A processor, computer, or computer system may be any kind of device, machine or dedicated circuit, or collection or portion thereof, with processing capability such that it can execute instructions. A processor may be any kind of general purpose or dedicated processor, such as a CPU, GPU, system-on-chip, state machine, media processor, an application-specific integrated circuit (ASIC), a programmable logic array, a field-programmable gate array (FPGA), or the like. A computer or computer system may comprise one or more processors.

It is also intended to encompass software which defines a configuration of hardware as described herein, such as HDL (hardware description language) software, as is used for designing integrated circuits, or for configuring programmable chips, to carry out desired functions. That is, there may be provided a computer readable storage medium having encoded thereon computer readable program code in the form of an integrated circuit definition dataset that when processed (i.e. run) in an integrated circuit manufacturing system configures the system to manufacture a circuit configured to perform any of the methods described herein, or to manufacture a circuit comprising any apparatus described herein. An integrated circuit definition dataset may be, for example, an integrated circuit description.

Therefore, there may be provided a method of manufacturing, at an integrated circuit manufacturing system, a circuit or processor as described herein. Furthermore, there may be provided an integrated circuit definition dataset that, when processed in an integrated circuit manufacturing system, causes the method of manufacturing a circuit or processor to be performed.

An integrated circuit definition dataset may be in the form of computer code, for example as a netlist, code for configuring a programmable chip, as a hardware description language defining hardware suitable for manufacture in an integrated circuit at any level, including as register transfer level (RTL) code, as high-level circuit representations such as Verilog or VHDL, and as low-level circuit representations such as OASIS® and GDSII. Higher level representations which logically define hardware suitable for manufacture in an integrated circuit (such as RTL) may be processed at a computer system configured for generating a manufacturing definition of an integrated circuit in the context of a software environment comprising definitions of circuit elements and rules for combining those elements in order to generate the manufacturing definition of an integrated circuit so defined by the representation. As is typically the case with software executing at a computer system so as to define a machine, one or more intermediate user steps (e.g. providing commands, variables etc.) may be required in order for a computer system configured for generating a manufacturing definition of an integrated circuit to execute code defining an integrated circuit so as to generate the manufacturing definition of that integrated circuit.

An example of processing an integrated circuit definition dataset at an integrated circuit manufacturing system so as to configure the system to manufacture a circuit or processor will now be described with respect to FIG. 8.

Figure 9:
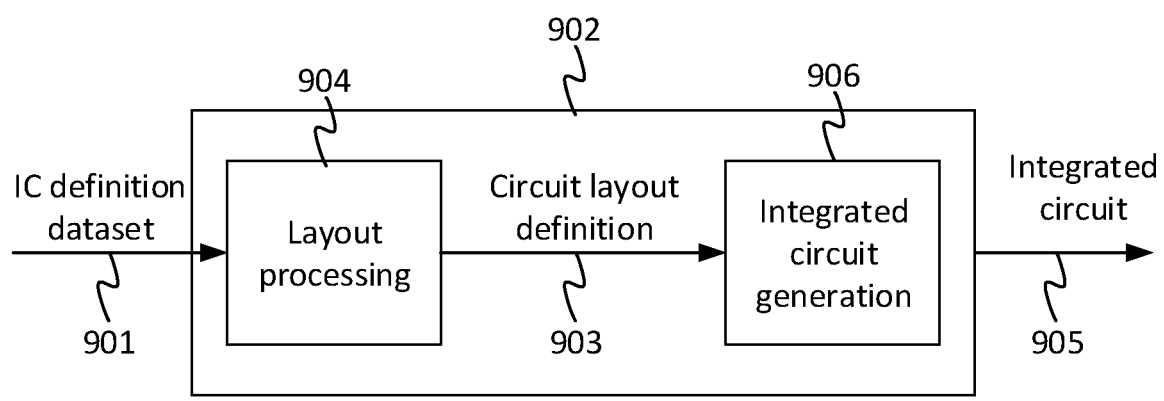
FIG. 9 is a schematic block diagram of an integrated circuit manufacturing system for generating an integrated circuit embodying a graphics processing system.

FIG. 9 shows an example of an integrated circuit (IC) manufacturing system 902 which is configured to manufacture a circuit or processor as described in any of the examples herein. In particular, the IC manufacturing system 902 comprises a layout processing system 904 and an integrated circuit generation system 906. The IC manufacturing system 902 is configured to receive an IC definition dataset 901 (e.g. defining a circuit or processor as described in any of the examples herein), process the IC definition dataset, and generate an IC 905 according to the IC definition dataset (e.g. which embodies a circuit or processor as described in any of the examples herein). The processing of the IC definition dataset configures the IC manufacturing system 902 to manufacture an integrated circuit embodying a circuit or processor as described in any of the examples herein.

The layout processing system 904 is configured to receive and process the IC definition dataset 901 to determine a circuit layout. Methods of determining a circuit layout from an IC definition dataset are known in the art, and for example may involve synthesising RTL code to determine a gate level representation of a circuit to be generated, e.g. in terms of logical components (e.g. NAND, NOR, AND, OR, MUX and FLIP-FLOP components). A circuit layout can be determined from the gate level representation of the circuit by determining positional information for the logical components. This may be done automatically or with user involvement in order to optimise the circuit layout. When the layout processing system 904 has determined the circuit layout it may output a circuit layout definition 903 to the IC generation system 906. A circuit layout definition may be, for example, a circuit layout description.

The IC generation system 906 generates an IC 905 according to the circuit layout definition 903, as is known in the art. For example, the IC generation system 906 may implement a semiconductor device fabrication process to generate the IC, which may involve a multiple-step sequence of photo lithographic and chemical processing steps during which electronic circuits are gradually created on a wafer made of semiconducting material. The circuit layout definition may be in the form of a mask which can be used in a lithographic process for generating an IC according to the circuit definition. Alternatively, the circuit layout definition provided to the IC generation system 906 may be in the form of computer-readable code which the IC generation system 906 can use to form a suitable mask for use in generating an IC.

The layout processing system may be configured to determine positional information for logical components of a circuit derived from the integrated circuit description so as to generate a circuit layout description of an integrated circuit embodying the graphics processing system.

The different processes performed by the IC manufacturing system 902 may be implemented all in one location, e.g. by one party. Alternatively, the IC manufacturing system 902 may be a distributed system such that some of the processes may be performed at different locations, and may be performed by different parties. For example, some of the stages of: (i) synthesising RTL code representing the IC definition dataset to form a gate level representation of a circuit to be generated, (ii) generating a circuit layout based on the gate level representation, (iii) forming a mask in accordance with the circuit layout, and (iv) fabricating an integrated circuit using the mask, may be performed in different locations and/or by different parties.

In other examples, processing of the integrated circuit definition dataset at an integrated circuit manufacturing system may configure the system to manufacture a circuit or processor without the IC definition dataset being processed so as to determine a circuit layout. For instance, an integrated circuit definition dataset may define the configuration of a reconfigurable processor, such as an FPGA, and the processing of that dataset may configure an IC manufacturing system to generate a reconfigurable processor having that defined configuration (e.g. by loading configuration data to the FPGA).

In some embodiments, an integrated circuit manufacturing definition dataset, when processed in an integrated circuit manufacturing system, may cause an integrated circuit manufacturing system to generate a device as described herein. For example, the configuration of an integrated circuit manufacturing system in the manner described above with respect to FIG. 9 by an integrated circuit manufacturing definition dataset may cause a device as described herein to be manufactured.

In some examples, an integrated circuit definition dataset could include software which runs on hardware defined at the dataset or in combination with hardware defined at the dataset. In the example shown in FIG. 9, the IC generation system may further be configured by an integrated circuit definition dataset to, on manufacturing an integrated circuit, load firmware onto that integrated circuit in accordance with program code defined at the integrated circuit definition dataset or otherwise provide program code with the integrated circuit for use with the integrated circuit.

The concepts set forth in this application, when implemented in devices, apparatus, modules, and/or systems (as well as in methods implemented herein), give performance improvements when compared with known implementations, such as one or more of increased computational performance, reduced latency, increased throughput, and/or reduced power consumption. For example, a performance improvement may be traded against layout area, thereby matching the computational performance of a known implementation but using less silicon and/or using less power. Conversely, concepts set forth in this application that give rise to improvements in the physical implementation of the devices, apparatus, modules, and systems (such as reduced silicon area and/or power consumption) may be traded for improved computational performance. Furthermore, for the manufacture of such devices, apparatus, modules, and systems (e.g. in integrated circuits) performance improvements can be tailored towards the physical implementation, thereby improving the method of manufacture.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein. In view of the foregoing description it will be evident to a person skilled in the art that various modifications may be made within the scope of the invention.

According to one aspect disclosed herein, there is provided a circuit as set out in the Summary section.

In embodiments, the control circuitry may be further operable to operate the circuit in the second and third modes simultaneously.

In embodiments, each of the logic units may comprise an arithmetic logic unit, the operation which each logic unit is configured to perform being an arithmetic operation.

In embodiments, the operation which each of the logic units is configured to perform may comprise, in the second mode, a difference operation to determine a difference between the respective first and second inputs, the difference being the respective result.

In embodiments, the control circuitry may be configured to trigger each logic unit to perform the operation in the second mode in response to executing an instance of a first type of gradient instruction, being a single machine code instruction of an instruction set of the processor.

In embodiments, in the third mode the operation may also comprise the difference operation.

In embodiments, the circuit may be configured to trigger each logic unit to perform the operation in the third mode in response to executing an instance of a second type of gradient instruction, being a single machine code instruction of an instruction set of the processor.

In embodiments, the first input of each of said logic units may be one of a pair of respective multiplication inputs, and the second input of each of said logic units may be a respective addend input. In this case, the operation which each of the logic units is configured to perform may comprise, in the first mode, a multiply-accumulate operation to determine a sum of: the respective addend input, and a product of the respective multiplication inputs; the sum being the respective result.

In embodiments, the circuit may be configured to trigger each logic unit to perform the operation in the first mode in response to executing an instance of a multiply-accumulate instruction, being a single machine code instruction of an instruction set of the processor.

In embodiments, the control circuitry may be configured so as in a swap mode, to control the multiplexing circuitry to place a value of the first input line onto the second output line, and a value of the second input line on the first output line.

In embodiments, the circuit may be configured to trigger each logic unit to trigger operation in said swap mode in response to executing an instance of a first swap instruction, being a single machine code instruction of an instruction set of the processor.

In embodiments, the control circuitry may be configured so as in a further swap mode, to control the multiplexing circuitry to place a value of the third input line onto the fourth output line, and a value of the fourth input line on the third output line.

In embodiments, the circuit may be configured to trigger each logic unit to trigger operation in said further swap mode in response to executing an instance of a second swap instruction, being a single machine code instruction of an instruction set of the processor.

In embodiments, the processor may be programmed to supply a value of a different pixel or image fragment on the respective first input line of a different respective ones of said processing channels, and to use at least one of the second and third modes to perform gradient calculations to determine a gradient between pixels or fragments.

In embodiments, the processor may be programmed to supply a value of a different pixel or image fragment on the respective first input line of a different respective ones of said channels, and to use at least one of the swap modes of operation to swap positions of pixel or fragment values.

In embodiments, the respective output of each processing channel may comprise two individual output terminals. In the first, second and/or third modes (e.g. the MAC and/or gradient modes) the two respective output terminals may be held at the same value (thus forming a single logical output). In the swap modes, the two respective output terminals of each logic unit may be allowed to differ. The swap may be performed by operating the multiplexing circuitry to route one of the input lines of the logic unit of one of the processing channels to one of the two respective output terminals, and connecting that output terminal to the output line of said one of the processing channels; whilst routing one of the input lines of another of the processing channels to the other of the two output terminals of the logic unit of said one of the processing channels, and connecting this output terminal to the output line of said other processing channel.

According to further aspects disclosed herein, there may be provided a corresponding method of operating the circuit, and a corresponding computer program configured to operate the circuit. According to yet further aspects there may be provided a corresponding method of manufacturing the circuit, a corresponding manufacturing facility arranged to manufacture the circuit, and a corresponding circuit design data set embodied on computer-readable storage.

For instance according to one aspect there may be provided a non-transitory computer readable storage medium having stored thereon a computer readable description of the circuit of any embodiment herein which, when processed in an integrated circuit manufacturing system, causes the integrated circuit manufacturing system to: process, using a layout processing system, the computer readable description of the circuit so as to generate a circuit layout description of an integrated circuit embodying said circuit; and manufacture, using an integrated circuit generation system, the graphics processing system according to the circuit layout description.

According to another aspect, there may be provided an integrated circuit manufacturing system comprising: a non-transitory computer readable storage medium having stored thereon a computer readable description of the circuit of any embodiment disclosed herein; a layout processing system configured to process the computer readable description so as to generate a circuit layout description of an integrated circuit embodying said circuit; and an integrated circuit generation system configured to manufacture the circuit according to the circuit layout description.

According to another aspect there may be provided a method of manufacturing, using an integrated circuit manufacturing system, a circuit of any embodiment disclosed herein, the method comprising: processing, using a layout processing system, a computer readable description of said circuit so as to generate a circuit layout description of an integrated circuit embodying the circuit; and manufacturing, using an integrated circuit generation system, the circuit according to the circuit layout description.

Other variants and/or applications of the disclosed techniques may become apparent to a person skilled in the art once given the disclosure herein. The scope of the present disclosure is not limited by the above-described embodiments but only by the claims.

What is claimed is:

1. A circuit for use in a processor, the circuit comprising:
    a first processing channel comprising: a respective first input line, second input line and output line, and a first logic unit configured to perform an operation on a respective first input and second input of the first logic unit to produce a respective result at a respective output of the first logic unit, wherein the first input of the first logic unit is coupled to the first input line of the first processing channel;
    a second processing channel comprising: a respective first input line, second input line and output line, and a second logic unit configured to perform an operation on a respective first input and second input of the second logic unit to produce a respective result at a respective output of the second logic unit, wherein the first input of the second logic unit is coupled to the first input line of the second processing channel;
    multiplexing circuitry comprising:
    a first input multiplexer arranged to switch between: a respective first state in which the second input of the first logic unit is coupled to the second input line of the first processing channel, and a respective second state in which the second input of the first logic unit is instead coupled to the first input line of the second processing channel, and
    a first output multiplexer, arranged to switch between: a respective first state in which the output line of the second processing channel is coupled to the output of the second logic unit, and a respective second state in which the output line of the second processing channel is instead coupled to the output of the first logic unit; and control circuitry arranged to control the multiplexing circuitry in response to instructions being executed.

2. The circuit of claim 1, wherein the control circuitry is arranged to switch between a first mode in which the first input and output multiplexers are each set to the respective first state, and a second mode in which the first input and output multiplexers are each set to the respective second state, with the output line of the first processing channel being coupled to the output of the first logic unit in both the first and second modes.

3. The circuit of claim 2, wherein the control circuitry is configured to set the second processing unit to an idle, reduced-power state when in the second mode.

4. The circuit of claim 1, further comprising:

a third processing channel comprising: a respective first input line, second input line and output line, and a third logic unit configured to perform an operation on a respective first input and second input of the third logic unit to produce a respective result at a respective output of the third logic unit, wherein the first input of the third logic unit is coupled to the first input line of the third processing channel;

wherein the multiplexing circuitry comprises:

a second input multiplexer arranged to switch between: a respective first state in which the second input of the third logic unit is coupled to the second input line of the third processing channel, and a respective second state in which the second input of the third logic unit is instead coupled to the first input line of the first processing channel, and a second output multiplexer arranged to switch between: a respective first state in which the output line of the first processing channel is coupled to the output of the first logic unit, and a respective second state in which the output line of the first processing channel is instead coupled to the output of the third logic unit.

5. The circuit of claim 4, wherein:

the control circuitry is arranged to switch between a first mode in which the first input and output multiplexers are each set to the respective first state, and a second mode in which the first input and output multiplexers are each set to the respective second state, with the output line of the first processing channel being coupled to the output of the first logic unit in both the first and second modes; and the control circuitry is configured to switch between the first mode, the second mode and a third mode; wherein in the first mode the second input and output multiplexers are each set to the respective first state, in the second mode the second output multiplexer is set to the respective first state, and in the third mode the first output multiplexer is set to the respective first state and the second input and output multiplexers are each set to the respective second state.

6. The circuit of claim 5, wherein the control circuitry is configured to set the third logic unit to an idle, reduced-power state when in the second mode; and to set the first logic unit to an idle, reduced-power state when in the third mode.

7. The circuit of claim 4, further comprising:

a fourth processing channel comprising: a respective first input line, second input line and output line, and a fourth logic unit configured to perform an operation on a respective first input and second input of the fourth logic unit to produce a respective result at a respective output of the fourth logic unit, wherein the first input of the fourth logic unit is coupled to the first input line of the fourth processing channel;

wherein the multiplexing circuitry comprises:

a third input multiplexer arranged to switch between: a respective first state in which the second input of the second logic unit is coupled to the second input line of the second processing channel, and a respective second state in which the second input of the second logic unit is instead coupled to the first input line of the fourth processing channel, a fourth input multiplexer arranged to switch between: a respective first state in which the second input of the fourth logic unit is coupled to the second input line of the fourth processing channel, and a respective second state in which the second input of the fourth logic unit is instead coupled to the first input line of the third processing channel, a third output multiplexer arranged to switch between: a respective first state in which the output line of the fourth processing channel is coupled to the output of the fourth logic unit, and a respective second state in which the output line of the fourth processing channel is instead coupled to the output of the second logic unit, and a fourth output multiplexer arranged to switch between: a respective first state in which the output line of the third processing channel is coupled to the output of the third logic unit, and a respective second state in which the output line of the third processing channel is instead coupled to the output of the fourth logic unit.

8. The circuit of claim 5, further comprising:

a fourth processing channel comprising: a respective first input line, second input line and output line, and a fourth logic unit configured to perform an operation on a respective first input and second input of the fourth logic unit to produce a respective result at a respective output of the fourth logic unit, wherein the first input of the fourth logic unit is coupled to the first input line of the fourth processing channel;

wherein the multiplexing circuitry comprises:

a third input multiplexer arranged to switch between: a respective first state in which the second input of the second logic unit is coupled to the second input line of the second processing channel, and a respective second state in which the second input of the second logic unit is instead coupled to the first input line of the fourth processing channel, a fourth input multiplexer arranged to switch between: a respective first state in which the second input of the fourth logic unit is coupled to the second input line of the fourth processing channel, and a respective second state in which the second input of the fourth logic unit is instead coupled to the first input line of the third processing channel, a third output multiplexer arranged to switch between: a respective first state in which the output line of the fourth processing channel is coupled to the output of the fourth logic unit, and a respective second state in which the output line of the fourth processing channel is instead coupled to the output of the second logic unit, and a fourth output multiplexer arranged to switch between: a respective first state in which the output line of the third processing channel is coupled to the output of the third logic unit, and a respective second state in which the output line of the third processing channel is instead coupled to the output of the fourth logic unit; and wherein in the first mode the third and fourth input multiplexers and the third and fourth output multiplexers are each set to the respective first state, in the second mode the fourth input multiplexer and fourth output multiplexer are each set to the respective second state whilst the third output multiplexer is set to the respective first state, and in the third mode the third input multiplexer and third output multiplexer are each set to the respective second state whilst the fourth output multiplexer is set to the respective first state.

9. The circuit of claim 8, wherein the control circuitry is configured to set the fourth logic unit to an idle, reduced-power state in the third mode.

10. The circuit of claim 5, wherein the control circuitry is further operable to operate the circuit in the second and third modes simultaneously.

11. The circuit of claim 1, wherein each of the logic units comprises an arithmetic logic unit, the operation which each logic unit is configured to perform being an arithmetic operation.

12. The circuit of claim 2, wherein the operation which each of the logic units is configured to perform comprises, in the second mode, a difference operation to determine a difference between the respective first and second inputs, the difference being the respective result.

13. The circuit of claim 12, wherein the control circuitry is configured to trigger each logic unit to perform the operation in the second mode in response to executing an instance of a first type of gradient instruction, being a single machine code instruction of an instruction set of the processor.

14. The circuit of claim 5, wherein:
wherein the operation which each of the logic units is configured to perform comprises, in the second mode, a difference operation to determine a difference between the respective first and second inputs, the difference being the respective result; and
in the third mode the operation also comprises the difference operation.

15. The circuit of claim 14, configured to trigger each logic unit to perform the operation in the third mode in response to executing an instance of a second type of gradient instruction, being a single machine code instruction of an instruction set of the processor.

16. The circuit of claim 2, wherein the first input of each of said logic units is one of a pair of respective multiplication inputs, and the second input of each of said logic units is a respective addend input; wherein the operation which each of the logic units is configured to perform comprises, in the first mode, a multiply-accumulate operation to determine a sum of: the respective addend input, and a product of the respective multiplication inputs; the sum being the respective result.

17. The circuit of claim 16, configured to trigger each logic unit to perform the operation in the first mode in response to executing an instance of a multiply-accumulate instruction, being a single machine code instruction of an instruction set of the processor.

18. The circuit of claim 1, wherein the control circuitry is configured so as in a swap mode, to control the multiplexing circuitry to place a value of the first input line onto the second output line, and a value of the second input line on the first output line.

19. A non-transitory computer readable storage medium having stored thereon a computer readable dataset description that, when processed in an integrated circuit manufacturing system, causes the integrated circuit manufacturing system to manufacture an integrated circuit embodying a circuit for use in a processor, the circuit comprising:
a first processing channel comprising: a respective first input line, second input line and output line, and a first logic unit configured to perform an operation on a respective first input and second input of the first logic unit to produce a respective result at a respective output of the first logic unit, wherein the first input of the first logic unit is coupled to the first input line of the first processing channel;
a second processing channel comprising: a respective first input line, second input line and output line, and a second logic unit configured to perform an operation on a respective first input and second input of the second logic unit to produce a respective result at a respective output of the second logic unit, wherein the first input of the second logic unit is coupled to the first input line of the second processing channel;
multiplexing circuitry comprising:
a first input multiplexer arranged to switch between: a respective first state in which the second input of the first logic unit is coupled to the second input line of the first processing channel, and a respective second state in which the second input of the first logic unit is instead coupled to the first input line of the second processing channel, and
a first output multiplexer, arranged to switch between: a respective first state in which the output line of the second processing channel is coupled to the output of the second logic unit, and a respective second state in which the output line of the second processing channel is instead coupled to the output of the first logic unit; and
control circuitry arranged to control the multiplexing circuitry in response to instructions being executed.

20. A method of operating a circuit in a processor, the circuit comprising:
a first processing channel comprising: a respective first input line, second input line and output line, and a first logic unit configured to perform an operation on a respective first input and second input of the first logic unit to produce a respective result at a respective output of the first logic unit, wherein the first input of the first logic unit is coupled to the first input line of the first processing channel; and
a second processing channel comprising: a respective first input line, second input line and output line, and a second logic unit configured to perform an operation on a respective first input and second input of the second logic unit to produce a respective result at a respective output of the second logic unit, wherein the first input of the second logic unit is coupled to the first input line of the second processing channel;
wherein the method comprises controlling multiplexing circuitry in response to execution of instructions by the processor, including:
operating a first input multiplexer of the multiplexing circuitry to switch between: a respective first state in which the second input of the first logic unit is coupled to the second input line of the first processing channel, and a respective second state in which the second input of the first logic unit is instead coupled to the first input line of the second processing channel, and operating a first output multiplexer of the multiplexing circuitry to switch between: a respective first state in which the output line of the second processing channel is coupled to the output of the second logic unit, and a respective second state in which the output line of the second processing channel is instead coupled to the output of the first logic unit.

* * * * *